(12) United States Patent
Liu et al.

(10) Patent No.: US 12,130,132 B2
(45) Date of Patent: Oct. 29, 2024

(54) METHOD AND DEVICE OF AVOIDING ROBOT FROM OBSTACLE, AND CONTROLLER

(71) Applicant: SHENZHEN YUEJIANG TECHNOLOGY CO., LTD., Shenzhen (CN)

(72) Inventors: Peichao Liu, Shenzhen (CN); Rui Huang, Shenzhen (CN); Xulin Lang, Shenzhen (CN); Linpan Cao, Shenzhen (CN)

(73) Assignee: SHENZHEN YUEJIANG TECHNOLOGY CO., LTD., Guangdong (CN)

( * ) Notice: Subject to any disclaimer, the term of this patent is extended or adjusted under 35 U.S.C. 154(b) by 341 days.

(21) Appl. No.: 17/213,173

(22) Filed: Mar. 25, 2021

(65) Prior Publication Data

US 2021/0237271 A1  Aug. 5, 2021

Related U.S. Application Data

(63) Continuation-in-part of application No. PCT/CN2019/106039, filed on Sep. 17, 2019.

(30) Foreign Application Priority Data

| Aug. 2, 2019 | (CN) | ............... 201921252998.9 |
| Aug. 2, 2019 | (CN) | ............... 201921258844.0 |
| Aug. 2, 2019 | (CN) | ............... 201921265549.8 |

(51) Int. Cl.
*B25J 9/16* (2006.01)
*B25J 13/08* (2006.01)
(Continued)

(52) U.S. Cl.
CPC ............... *G01B 7/023* (2013.01); *B25J 9/161* (2013.01); *B25J 9/1651* (2013.01); *B25J 9/1666* (2013.01);
(Continued)

(58) Field of Classification Search
CPC .. G01B 7/023; G01B 7/14; B25J 9/161; B25J 9/1651; B25J 9/1666; B25J 9/1694;
(Continued)

(56) References Cited

U.S. PATENT DOCUMENTS

| 4,661,797 | A | 4/1987 | Schmall |
| 5,988,971 | A | 11/1999 | Fossey et al. |

(Continued)

FOREIGN PATENT DOCUMENTS

| CA | 2827699 | 3/2014 |
| CN | 1220931 | 6/1999 |

(Continued)

OTHER PUBLICATIONS

Dean-Leon, Emmanuel, et al., "Robotic Technologies for Fast Deployment of Industrial Robot Systems," 42nd IEEE Industrial Electronics Conference, Oct. 2016.
(Continued)

*Primary Examiner* — B M M Hannan
*Assistant Examiner* — Matthew C Gammon
(74) *Attorney, Agent, or Firm* — LOZA & LOZA LLP; Michael Fedrick

(57) ABSTRACT

A method of avoiding collision between mechanical equipment (10) and obstacles, and a device and controller for this, by detecting whether an external conductor is approaching the device (10); when detecting that the external conductor is approaching the mechanical equipment (10), generating an electrical signal representing a distance between the external conductor and the housing of the mechanical equip-
(Continued)

ment (10) or a change of the distance between the external conductor and the housing of the mechanical equipment (10); controlling the mechanical equipment (10) based on electrical signal so as to avoid the mechanical equipment (10) from collision with the external conductor or to reduce a strength of the collision.

15 Claims, 14 Drawing Sheets

(51) Int. Cl.
| | |
|---|---|
| *B25J 19/02* | (2006.01) |
| *G01B 7/02* | (2006.01) |
| *G01B 7/14* | (2006.01) |
| *G01D 5/24* | (2006.01) |
| *G01D 5/241* | (2006.01) |
| *G01R 21/00* | (2006.01) |
| *G01R 22/02* | (2006.01) |
| *G01V 3/08* | (2006.01) |
| *H03J 1/00* | (2006.01) |

(52) U.S. Cl.
CPC .......... *B25J 9/1694* (2013.01); *B25J 13/086* (2013.01); *B25J 13/089* (2013.01); *B25J 19/02* (2013.01); *G01B 7/14* (2013.01); *G01D 5/24* (2013.01); *G01D 5/241* (2013.01); *G01R 21/00* (2013.01); *G01R 22/02* (2013.01); *G01V 3/088* (2013.01); *H03J 1/005* (2013.01); *H03J 2200/10* (2013.01); *H03J 2200/29* (2013.01)

(58) Field of Classification Search
CPC ........ B25J 13/086; B25J 13/089; B25J 19/02; B25J 9/1676; G01D 5/24; G01D 5/241; G01D 5/243; G01D 5/2417; G01V 3/088; G05B 2219/37284; G05B 19/0423; G05B 2219/25257; H03K 17/955
See application file for complete search history.

(56) References Cited

U.S. PATENT DOCUMENTS

| | | | |
|---|---|---|---|
| 2004/0187593 A1 | 9/2004 | Okada | |
| 2008/0125893 A1* | 5/2008 | Tilove | B25J 9/1666 700/103 |
| 2008/0306628 A1* | 12/2008 | Ng-Thow-Hing | B25J 9/1664 901/50 |
| 2017/0066130 A1* | 3/2017 | Corkum | B25J 9/1676 |
| 2017/0257094 A1 | 9/2017 | Schupp et al. | |
| 2018/0236667 A1 | 8/2018 | Gombert et al. | |
| 2019/0145798 A1 | 5/2019 | Kamiya et al. | |
| 2021/0237271 A1 | 8/2021 | Liu et al. | |
| 2021/0255350 A1 | 8/2021 | Peichao et al. | |
| 2022/0170974 A1 | 6/2022 | Dai et al. | |

FOREIGN PATENT DOCUMENTS

| | | |
|---|---|---|
| CN | 1788859 | 6/2006 |
| CN | 102015223 | 4/2011 |
| CN | 102015223 A | 4/2011 |
| CN | 201903787 | 7/2011 |
| CN | 103299776 | 9/2013 |
| CN | 104765363 | 7/2015 |
| CN | 105225985 | 1/2016 |
| CN | 205996974 | 3/2017 |
| CN | 205996974 A | 3/2017 |
| CN | 106695889 | 5/2017 |
| CN | 106695889 A | 5/2017 |
| CN | 106716838 | 5/2017 |
| CN | 106926239 | 7/2017 |
| CN | 206296915 | 7/2017 |
| CN | 107000214 | 8/2017 |
| CN | 206499476 | 9/2017 |
| CN | 107229277 | 10/2017 |
| CN | 107436159 | 12/2017 |
| CN | 206818356 | 12/2017 |
| CN | 206946502 | 1/2018 |
| CN | 108241373 | 7/2018 |
| CN | 108602187 | 9/2018 |
| CN | 108602187 A | 9/2018 |
| CN | 108637460 | 10/2018 |
| CN | 109382823 | 2/2019 |
| CN | 109397272 | 3/2019 |
| CN | 109544872 | 3/2019 |
| CN | 109544872 A | 3/2019 |
| CN | 109708785 | 5/2019 |
| CN | 109716652 | 5/2019 |
| CN | 109773764 | 5/2019 |
| CN | 109773832 | 5/2019 |
| CN | 110315556 | 10/2019 |
| CN | 110315556 A | 10/2019 |
| CN | 112605998 | 4/2021 |
| DE | 10061351 | 6/2002 |
| DE | 102010047198 | 4/2012 |
| EP | 0158593 | 10/1985 |
| EP | 0158593 A1 | 10/1985 |
| EP | 3246137 | 11/2017 |
| EP | 3258602 | 12/2017 |
| JP | H07241790 | 9/1995 |
| JP | H07241790 A | 9/1995 |
| JP | 2010010116 | 1/2010 |
| WO | 2017191573 | 11/2017 |
| WO | 2019030042 | 2/2019 |

OTHER PUBLICATIONS

Yibo Yu, "Resonance-Based Capacitive Sensing Using LDC23114," Texas Instruments, Dec. 2017.

* cited by examiner

METHOD AND DEVICE OF AVOIDING ROBOT FROM OBSTACLE, AND CONTROLLER

CROSS-REFERENCE TO RELATED APPLICATIONS

The present disclosure is a continuation-in-part of PCT Patent Application No. PCT/CN2019/106039, with an international filing date of Sep. 17, 2019, which claims priority to Chinese Patent Application Nos. 201921258844.0, 201921252998.9, and 201921265549.8, filed with the China National Intellectual Property Administration on Aug. 2, 2019, and entitled "robot electronic skin and robot," "non-contact electronic skin sensing circuit and device," and "communication layout structure of electronic skin system," respectively. The disclosures of the foregoing applications are incorporated herein by reference in their entirety.

TECHNICAL FIELD

The present disclosure relates to the field of robot technologies, and in particular to a method and a device of avoiding robot from obstacle, and controller.

BACKGROUND

A robot is a machine device that can perform work automatically. The robot can run pre-programmed programs, or act according to rules established by artificial intelligence technology. Robots can assist humans in their work, and even replace humans in performing some highly dangerous work, it has huge development prospects in civil, industrial and other fields.

At present, a main method for mechanical equipment to detect a nearby object is to make physical contact with the object through housing component. Taking the contact-type of resistance-type housing component as an example, the resistive housing component causes the deformation of the housing component after the close object comes into contact with the mechanical equipment, and sends a contact signal representing the deformation. However, if the nearby object does not directly contact the housing of the mechanical equipment, the mechanical equipment cannot realize the non-contact distance detection of the nearby object, and when the mechanical equipment is in motion, contact between the mechanical equipment and the object can easily cause damage to the object or personal injury, which poses certain safety risks.

SUMMARY

A main technical problem solved by the present disclosure is to provide a method and a device of avoiding robot from obstacle, and controller, thereby reducing device damage or personal injury caused by collision and improving safety.

In order to solve the above technical problems, a technical solution adopted in the present disclosure is to provide a method of avoiding a device from collision with obstacle, including:
 detecting whether an external conductor is approaching the device;
 generating an electrical signal that represents a distance between the external conductor and housing of the device or a change of the distance between the external conductor and housing of the device when detecting that the external conductor is approaching the device; and
 controlling the device to avoid the device from collision with the external conductor or to reduce a strength of the collision based on the electrical signal.

In order to solve the above technical problems, another technical solution adopted in the present disclosure is to provide a method of avoiding a device from collision with an obstacle, including:
 receiving an electrical signal that represents a distance between the external conductor and the housing of the device or a change of the distance between the external conductor and the housing of the device, wherein the electrical signal is obtained by detecting whether the external conductor is approaching the device;
 determining whether the distance between the external conductor and housing of the device is less than a first threshold value or whether an approaching speed between the external conductor and the housing of the device is greater than a second threshold value based on the electrical signal; and
 controlling the device to avoid the device from collision with the external conductor or to reduce a strength of the collision if the distance is less than the first threshold value or an approaching speed is greater than the second threshold value.

In order to solve the above technical problems, another technical solution adopted in the present disclosure is to provide a device including a base, a moving component, a driving component, an electronic skin, and a control system.
 wherein, the moving component is connected to the base and being capable of swinging, rotating or moving linearly relative to the base; the driving component is configured to drive or brake the moving component; the electronic skin is configured to cover at least a part of the surface of the moving component, to detect whether the external conductor is approaching the device; the control system is configured to execute the method of avoiding the device from collision with obstacle in the present disclosure to control the drive component.

In order to solve the above technical problem, another technical solution adopted in the present disclosure is to provide a device controller, including a circuit board, a processor, a first communication interface, and a second communication interface;
 the processor is provided on the circuit board;
 the first communication interface is configured to be coupled the electronic skin of the device; and
 the second communication interface is configured to be coupled the drive component of the device;
 wherein, the processor is configured to perform the method of avoiding a device from collision with obstacle in the present disclosure, so as to receive an electrical signal representing the distance between the external conductor and the housing of the device or a change of the distance between the external conductor and the housing of the device by the first communication interface, and sends an instruction by the second communication interface to the drive component to control the device to avoid the device from collision with the external conductor or to reduce the strength of collision.
 the beneficial effects of the present disclosure are summarized as follows:
 the device of the embodiment generates an electrical signal that represents a distance between an external conductor and housing of the device or a change of the distance between an external conductor and housing of the device when detecting that the external conductor is approaching the device, the device can determine the distance between the external conductor and the device or a change of the distance between the external conductor and the device based on the electrical signal. Therefore, when an external conductor is found to be approaching the device or when an external conductor such as a human body suddenly appears to be approaching the movement track of the device, the device can take timely measures to avoid collision with the external conductor or to reduce the strength of collision with the external conductor, thereby reducing the damage to the device due to collision or personal injury, and improving safety.

BRIEF DESCRIPTION OF THE DRAWINGS

In order to describe the technical solutions more clearly in the embodiments of the present disclosure or the prior art, the following will briefly introduce the drawings needed for the embodiments or the description of prior art. Obviously, the drawings in the following description are merely some embodiments in the present disclosure, for those of ordinary skill in the field, other drawings can be obtained based on these drawings without creative work.

DETAILED DESCRIPTION OF EXAMPLE EMBODIMENTS

The technical solutions in the embodiments of the present disclosure will be described clearly and completely in conjunction with the drawings in the embodiments of the present disclosure. Obviously, the described embodiments are only a part of the embodiments of the present disclosure instead of all the embodiments. Based on the embodiments in the present disclosure, all other embodiments obtained by those of ordinary skill in the art without creative work shall fall within the scope of protection of the present disclosure.

The terms "first", "second", and "third" in the embodiments of the present disclosure are only used for descriptive purposes, and cannot be understood as indicating or implying relative importance or implicitly indicating the number of indicated technical features. Therefore, the features defined with "first", "second", and "third" may explicitly or implicitly include at least one of the features. In the description of the present disclosure, "a plurality of" means at least two, such as two, three, etc., unless specifically defined otherwise. In addition, the terms "including" and "having" and any variations thereof are intended to cover non-exclusive inclusion. For example, a process, method, system, product, or device that includes a series of steps or units is not limited to the listed steps or units, but optionally includes unlisted steps or units, or optionally includes other steps or units inherent in these processes, methods, products or equipment as well.

The reference to "embodiments" means that a specific feature, structure or characteristic described in the embodiments may be included in at least one embodiment of the present disclosure. The appearance of the phrase in various places in the specification does not necessarily refer to the same embodiment, nor is it an independent or alternative embodiment mutually exclusive with other embodiments. Those skilled in the field clearly and implicitly understand is, the embodiments described in the present disclosure can be combined with other embodiments.

Figure 1:
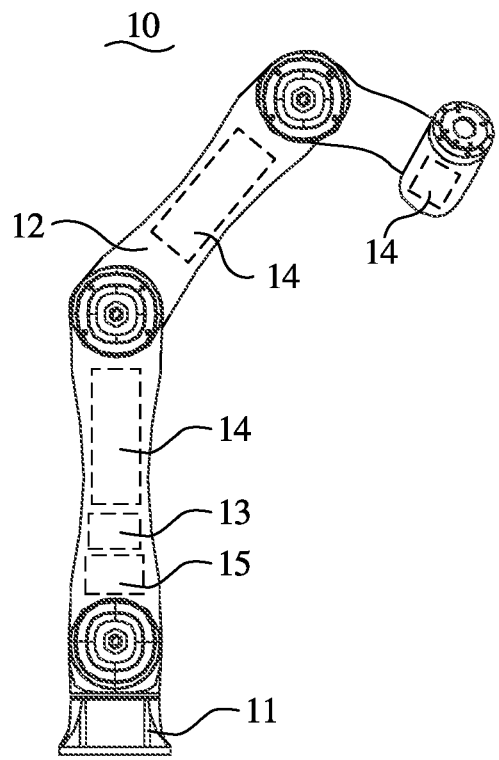
FIG. 1 is a schematic structural view of an embodiment of the device of the present disclosure.

Referring to FIG. 1, FIG. 1 is a schematic structural view of an embodiment of the device of the present disclosure. The device 10 described in this embodiment is, for example, a mechanical equipment, can be a robotic arm such as 1 degree of freedom robotic arm, 2 degree of freedom robotic arm, 3 degree of freedom robotic arm or 6 degree of freedom robotic arm; or the device can also be a racing car, a sweeping robot, a car, a balance car, a bumper car or a gantry crane. The device includes a base 11, a moving component 12, a driving component 13, an electronic skin 14 and a control system 15. The control system 15 can control the driving component 13 so that the driving component 13 drives the moving component 12 to move in a predetermined manner.

In this embodiment, the moving component 12 of the device 10 is connected to the base 11. The base 11 is, for example, a fixed seat, which can be fixedly installed on certain workbenches; or the base 11 can also be movable, for example, a driving wheel is installed at the bottom of the base 11, which can drive the device 10 to move, thus increasing the flexibility of the device 10. In this embodiment, the moving component 12 of the device 10 may swing, rotate or move in a straight line relative to the base 11 driven by the driving component 13. In certain embodiments, the moving component 12 may include a plurality of articulated arms, and each articulated arm can be rotatably connected, the driving component 13 can drive a plurality of articulated arms to move in their respective moving directions so that the end of the articulated arm of the device 10 can move in various directions. The driving component 13 can also be used to brake the moving component 12 to stop its movement. In certain embodiments, the driving component 13 can also drive the device 10 to return to the predetermined state when braking the moving component 12.

As shown in FIG. 1, in this embodiment, the electronic skin 14 covers at least part of the surface of the moving component 12. It can be understood that in other embodiments, the electronic skin 14 can also cover the entire surface of the moving component 12, or can also cover the entire surface of the device 10, and the shape of the electronic skin 14 matches the surface shape of the device 10 housing. This helps the device 10 detect more accurately the proximity of external conductors from all directions. For example, the device 10 is a robotic arm type robot, and the electronic skin 14 may partially cover the housing of the long arm of the robot, or the electronic skin 14 may also cover the entire outer surface of the robot. The electronic skin 14 can be used to detect whether an external conductor is approaching the device 10. The electronic skin 14 includes, for example, an sensing circuit, and can be formed on the housing of the moving component 12. The sensing circuit can detect whether an external conductor is approaching the device 10. For example, when the external conductor is approaching the device 10, it causes a change in the capacitance of the sensing circuit. By detecting the change, it is determined that the external conductor is approaching specific part of the device 10, such as a joint or a long arm of the device. The device 10 can further determine the direction in which the external conductor is approaching the components of the device 10 through the change trend of the sensing circuit, so that the device 10 can accurately plan a safe and efficient obstacle avoidance path.

In this embodiment, when an external conductor is detected approaching the device 10, an electrical signal that represents the distance between the external conductor and the housing of the device 10 or a change of the distance between the external conductor and the housing of the device 10 can also be generated. The control system 15 can also calculate the distance between the external conductor and the housing of the device 10 and the change rule of the distance based on the electrical signal, in order to find the external conductor in time and control the driving component 13 to drive the moving component 12 in time to avoid the collision with the external conductor or to reduce the strength of collision with the external conductor.

For more functions and steps of the device 10 and its components in this embodiment, refer to the description of the following embodiments of the method of avoiding a mechanical equipment from collision with obstacle of the present disclosure.

Figure 2:
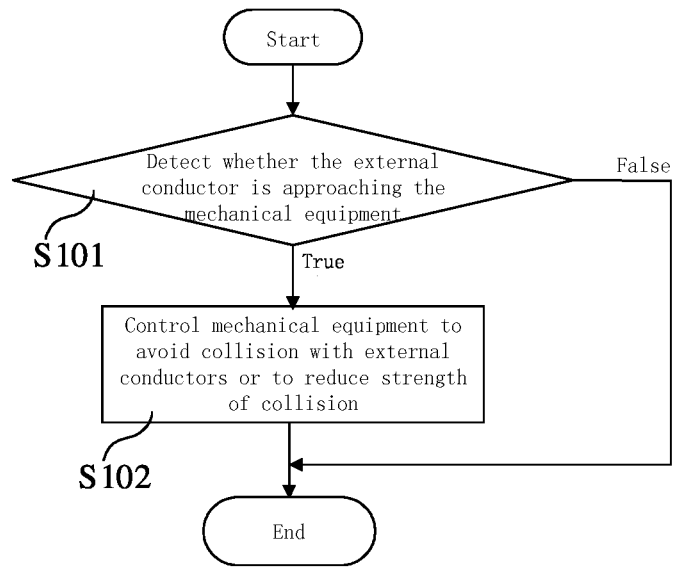
FIG. 2 is a schematic flowchart of the first embodiment of the method of avoiding a mechanical equipment from collision with obstacle of the present disclosure.

Referring to FIG. 2, the first embodiment of the method of avoiding a mechanical equipment from collision with obstacle of the present disclosure, with the entire mechanical equipment as the execution subject, includes:

S101: it is detected whether the external conductor is approaching the mechanical equipment.

In this embodiment, the external conductor is, for example, an object with conductive properties in the motion environment of a mechanical equipment, such as a human body. Mechanical equipment can detect whether the external conductor is approaching the mechanical equipment by self-capacitance method. For example, self-capacitive sensing electrodes are distributed on mechanical equipment, during the movement of mechanical equipment, when the external conductor is approaching the mechanical equipment, that is, when the relative distance decreases, the self-capacitive sensing electrode on the mechanical equipment changes, By detecting this change it can be determined that whether the external conductor is approaching the mechanical equipment. The self-capacitance method can monitor certain external conductors in the environment of the mechanical equipment in real time when the mechanical equipment is moving or not, so that the mechanical equipment can find the nearby external conductors in time and respond quickly.

In certain embodiments, the external conductor is approaching the mechanical equipment includes but is not limited to: when the mechanical equipment is in motion, it encounters a fixed external conductor; or when the mechanical equipment stops moving, it encounters an external conductor approaching at a certain speed; or, when the mechanical equipment is in motion, it encounters the moving external conductor and the movement path of the two objects makes the mechanical equipment and the external conductor close or may collide. In certain embodiments, the proximity of the external conductor to the mechanical equipment may also mean that the external conductor is approaching certain parts of the mechanical equipment, such as the end of the mechanical arm of a robotic arm.

In this embodiment, if no external conductor is detected or it is detected that the external conductor is not approaching the mechanical equipment, the mechanical equipment can continue to perform the current movement. If it is detected that the external conductor is approaching the mechanical equipment, the following step S102 can be executed.

S102: the mechanical equipment is controlled to avoid collision with the external conductor or reduce strength of collision.

In this embodiment, when the proximity of the external conductor is detected, the mechanical equipment can be controlled to avoid collision with the external conductor or reduce the strength of collision. For example, mechanical equipment can stop the movement or change the direction of movement to avoid collisions with external conductors and reduce damage caused by collisions. Alternatively, the mechanical equipment can also be controlled to decelerate or stop driving the mechanical equipment to reduce the strength of collision between the mechanical equipment and the external conductor, and effectively reduce the damage of the mechanical equipment caused by the strong collision when the mechanical equipment moves rapidly relative to the external conductor.

In certain embodiments, the mechanical equipment can also determine the specific parts of the mechanical equipment that need to avoid the obstacle before the obstacle avoidance, When controlling the mechanical equipment to avoid collision with external conductors or reduce the strength of collision, the motion or trajectory of the mechanical equipment can also be calculated based on the motion state of each part of the mechanical equipment and the motion state of the external conductor, so as to make the mechanical equipment more efficient and reasonable to avoid obstacles or reduce strength of collision, for example, the shortest or safer path is selected by calculation to avoid collision with external conductors.

The mechanical equipment of this embodiment can monitor certain external conductors in the environment of the mechanical equipment in real time, so that when an external conductor is found approaching the mechanical equipment or an external conductor such as a human body suddenly appears near the movement track of the mechanical equipment, the mechanical equipment can take timely measures to avoid collisions with external conductors or reduce the strength of collisions with external conductors, reduce damage to mechanical equipment or personal injuries caused by collisions, improve safety, and make the movement of mechanical equipment smoother.

Figure 3:
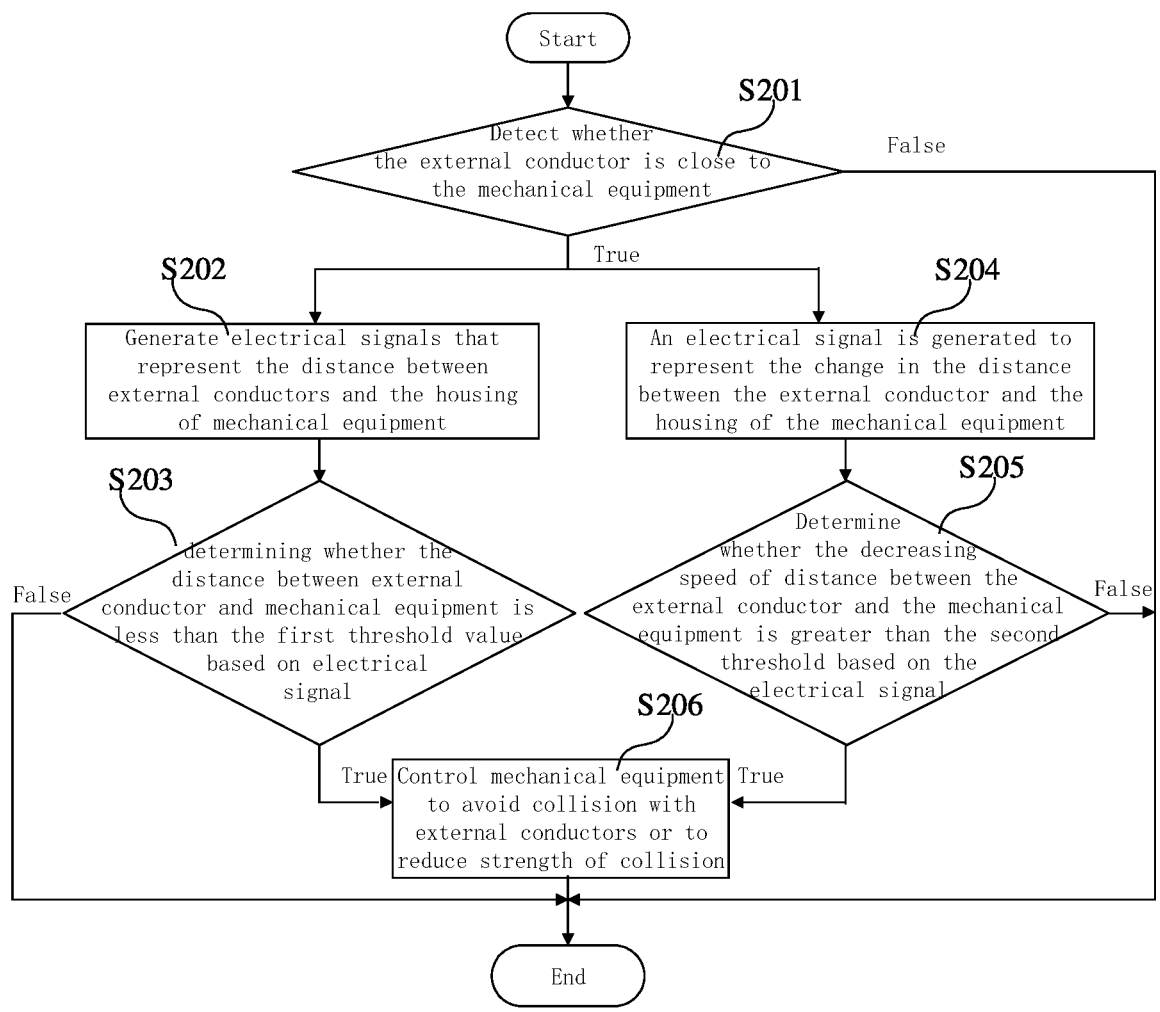
FIG. 3 is a schematic flowchart of the second embodiment of a method of avoiding a mechanical equipment from collision with obstacle of the present disclosure.

Referring to FIG. 3, the second embodiment of the method of avoiding a mechanical equipment from collision with obstacle of the present disclosure is further described on the basis of the first embodiment of the method of avoiding a mechanical equipment from collision with obstacle of the present disclosure, the parts in this embodiment that are the same as the first embodiment of the method of avoiding a mechanical equipment from collision with obstacle of the present disclosure will not be repeated. This embodiment takes the entire mechanical equipment as the execution subject, including:

S201: it is detected whether the external conductor is approaching the mechanical equipment.

In this embodiment, the mechanical equipment can detect whether the external conductor is approaching the mechanical equipment when it is moving or not moving. In certain embodiments, S201 may further include: detecting whether the external conductor is approaching the mechanical equipment with the electronic skin of the mechanical equipment.

The electronic skin includes, for example, an sensing circuit, which can detect whether an external conductor is approaching mechanical equipment. The sensing circuit can be formed on the housing of the mechanical equipment, which can more accurately sense that the external conductor is approaching the mechanical equipment. For example, part or all of the electronic skin is covered on the housing of the mechanical equipment, when the external conductor approaches, it causes the change of the sensing circuit of the part of the electronic skin that is closer to the external conductor, thereby detecting that the external conductor is approaching the mechanical equipment. In certain embodiments, when the external conductor and the mechanical equipment move relative to each other so that the external conductor gradually moves away from the mechanical equipment, it may also cause changes in the sensing circuit during the distance from the near to the distant, by detecting this trend, it can also be determined that the external conductor is moving away from the mechanical equipment, that is, not approaching the mechanical equipment.

In certain embodiments, the electronic skin may cover at least a part of the surface of the moving component of the mechanical equipment, so that the electronic skin can detect whether the moving component encounters an obstacle during the movement. For example, the electronic skin can cover the periphery and ends of the moving component. When encountering an external conductor, the part of the electronic skin closest to the external conductor detects the proximity of the external conductor and produces corresponding changes, while the distance is far or away from the direction of the external conductor the electronic skin does not change. By determining the position of the part of the electronic skin where the external conductor is detected, it can also effectively determine the direction of the external conductor approaches, which helps the mechanical equipment to accurately avoid obstacles according to the approaching direction of the external conductor. The electronic skin is used to detect whether the external conductor is approaching the mechanical equipment, which not only has high sensitivity and accuracy, but also detects the specific position of the external conductor, so that the mechanical equipment can avoid obstacles more reasonably and efficiently.

In this embodiment, if the external conductor is not detected or it is detected that the external conductor is not approaching the mechanical equipment, the mechanical equipment can maintain the original state such as continuing to move. When it is detected that an external conductor is approaching the mechanical equipment, the following steps S202~S203 and/or S204~S205 can be performed, as follows:

S202: an electrical signal is generated that represents the distance between the external conductor and the housing of the mechanical equipment.

In this embodiment, the mechanical equipment can generate an electrical signal when it detects that an external conductor is approaching the mechanical equipment. For example, when an external conductor is approaching mechanical equipment, the sensing circuit of the electronic skin of the mechanical equipment is changed, thereby generating a corresponding electrical signal. The electrical signal is, for example, a capacitance signal, a voltage signal, or a current signal. The electrical signal can be used to represent the distance between the external conductor and the housing. In certain embodiments, mechanical equipment can also measure the value of electrical signals, based on this value, the corresponding algorithm is used to calculate the distance between the external conductor and the mechanical equipment.

S203: it is determined whether the distance between the external conductor and the mechanical equipment is less than a first threshold value based on the electrical signal.

The first threshold value may be a distance length predetermined by the mechanical equipment. In this embodiment, the mechanical equipment can determine whether the distance between the external conductor and the mechanical equipment is less than the first threshold value based on the electrical signal. For example, the mechanical equipment detects the proximity of the external conductor and generates an electrical signal, it can calculate the distance between the external conductor and the mechanical equipment based on the value of the electrical signal, and then determine whether the distance is less than the first threshold value. In this embodiment, the distance between the external conductor and the mechanical equipment is calculated by the mechanical equipment based on the electrical signal generated when the external conductor approaches.

In certain embodiments, when a mechanical equipment uses an electronic skin to detect whether an external conductor approaches, due to the shape and size of mechanical equipment and external conductor, the external conductor can approach the mechanical equipment from multiple directions or there are multiple external conductors approaching the mechanical equipment, multiple electronic skins on the mechanical equipment respectively detect the proximity of external conductors, thereby generating multiple electrical signals. When calculating the distance between the external conductor and the mechanical equipment based on the electrical signal, the distance distribution data can be calculated separately. When judging whether the distance between the external conductor and the mechanical equipment is less than the first threshold value, the minimum distance between the external conductor and the mechanical equipment in the calculation result is preferred to be compared with the first threshold value. In certain embodiments, the mechanical equipment may also estimate the spatial position of the external conductor based on the distance distribution data. For example, the space coordinate is established based on the base center of the mechanical equipment and the overall axis, the mechanical equipment calculates the position, direction of the external conductor relative to the mechanical equipment and the motion track relative to the mechanical equipment based on the electrical signal generated when the external conductor approaches, when planning the obstacle avoidance path of mechanical equipment, the shortest and safest obstacle avoidance method and movement path can be selected based on the position, direction and movement trajectory of the external conductor.

In this embodiment, if it is determined that the distance between the external conductor and the mechanical equipment is greater than or equal to the first threshold value, the mechanical equipment can maintain the original motion state. If it is determined that the distance between the external conductor and the mechanical device is less than the first threshold value, the following step S206 can be performed.

S204: an electrical signal is generated that represents the change in the distance between the external conductor and the housing of the mechanical equipment.

In this embodiment, the electrical signal can be used to represent the change in the distance between the external conductor and the housing. For example, when a mechanical equipment detects the proximity of an external conductor, it sensing a change in the distance between the external conductor and the mechanical equipment to generate a corresponding electrical signal. The electrical signal can be a set of data, based on the set of values, the corresponding algorithm can be used to calculate the change in the distance between the external conductor and the mechanical equipment, or calculate the speed of change in distance change at which the distance between the external conductor and the mechanical equipment. By generating an electrical signal that represents the change in the distance between the external conductor and the housing, the change trend of the distance between the external conductor and the mechanical equipment can be determined based on the electrical signal, it is beneficial for the mechanical equipment to more accurately determine the distance of external conductor. In certain embodiments, the mechanical equipment can also predict the position of the external conductor based on the electrical signal, and respond in time to the external conductor that needs to be avoided.

S205: Based on the electrical signal, it is determined whether an approaching speed between the external conductor and the mechanical equipment is greater than the second threshold value.

The second threshold value can be a predetermined distance change speed of the mechanical equipment. In this embodiment, the mechanical equipment can determine based on the electrical whether an approaching speed between the external conductor and the mechanical equipment signal is greater than the second threshold value. For example, after the mechanical equipment detects the proximity of the external conductor and generates an electrical signal, it can calculate an approaching speed between the external conductor and the mechanical equipment based on the value of the electrical signal, and then determine whether the approaching speed is less than the second threshold value. In this embodiment, the approaching speed between the external conductor and the mechanical equipment is calculated by the mechanical equipment based on the electrical signal generated when the external conductor approaches.

In certain embodiments, the mechanical equipment uses an electronic skin to detect whether the external conductor approaches. The electronic skin includes a plurality of sensing electrodes, which are respectively connected to the sensing circuits. The electronic skin of mechanical equipment can use the capacitance between the sensing electrode and the external conductor or a change of the capacitance between the sensing electrode and the external conductor to detect the distance between the external conductor and the sensing electrode or a change of the distance between the external conductor and the sensing electrode, and generate an electrical signal that represents the distance between the sensing electrode and the external conductor or a change of the distance between the sensing electrode and the external conductor, That is, obtain the electrical signal that represents the distance between the mechanical equipment and the external conductor or a change of the distance between the mechanical equipment and the external conductor.

For example, the sensing circuit includes an oscillatory circuit, a detection circuit, and connection terminals. The oscillatory circuit and the detection circuit are coupled together to the connection terminal, and the connection terminal is coupled to the sensing electrode of the electronic skin. The oscillatory circuit is coupled to the electrode through the connection terminal, and changes the oscillating frequency when the external conductor is close the sensing electrode to form a capacitance. The detection circuit is coupled to the oscillatory circuit, and detects the oscillation frequency of the oscillatory circuit and output an electrical signal representing the oscillation frequency. Specifically, when the distance between the sensing electrode and the external conductor is less than a certain range, the sensing electrode and the external conductor form a capacitance. The capacitor is connected to the oscillatory circuit, which changes the equivalent capacitance value of the oscillatory circuit, which in turn changes the oscillation frequency of the oscillatory circuit. In this way, the change in the oscillation frequency is associated with the capacitance, so that the capacitance or data related to the distance between the external conductor and the sensing electrode can be calculated.

Due to the shape and size of mechanical equipment and external conductors, external conductors may approach the mechanical equipment from multiple directions, and multiple electrical signals may be generated; or when multiple external conductors is approaching the mechanical equipment, multiple electrical signals may be generated. When judging the approaching speed between the external conductor and the mechanical equipment, it can be determined whether the approaching speed corresponding to each electrical signal is greater than the second threshold value, it is beneficial to the mechanical equipment to avoid external conductors in multiple directions in time.

In some embodiments, the mechanical equipment uses an electronic skin to detect whether the external conductor is approaching the mechanical equipment, the electronic skin may also include a plurality of sensing electrodes formed on the housing of the mechanical equipment, and the plurality of sensing electrodes are respectively connected to the sensing circuit. The sensing electrode is, for example, a flexible electrode. Different sensing electrodes are located in different positions of the mechanical equipment. The sensing circuit can be used to detect whether the external conductor is approaching the mechanical equipment. When the external conductor approaches, the capacitance changes, generating at least two electrical signals that represent the distance between the external conductor and the sensing electrode or a change of the distance between the external conductor and the sensing electrode. Wherein, each electrical signal corresponds to a different sensing electrode. For example, when an external conductor is close the mechanical equipment, due to factors such as the shape of external conductors and mechanical equipment, the multiple sensing electrodes on the housing of the mechanical equipment sense the proximity of the external conductor to generate corresponding electrical signals.

Optionally, the mechanical equipment can also determine the electrical signal that represents the smallest distance between the external conductor and the sensing electrode or the largest change of the distance between the external conductor and the sensing electrode from the generated electrical signals, as the electrical signal that represents the distance between the external conductor and the housing of the mechanical equipment or a change of the distance between the external conductor and the housing of the mechanical equipment. For example, the mechanical equipment is a robotic arm type robot, and the robot includes a first articulated arm and a second articulated arm, and sensing electrodes are provided on the housing of the first articulated arm and the second articulated arm. When the external conductor is close the mechanical equipment, the sensing electrode on the first articulated arm and the sensing electrode on the second articulated arm both sense the proximity of the external conductor and respectively generate electrical signals representing the distance between the external conductor and the sensing electrode. The mechanical equipment can calculate the distance between the external conductor and each sensing electrode or a change of the distance between the external conductor and each sensing electrode according to the electrical signal, that is, the distance between the external conductor and the first articulated arm and the second articulated arm or a change of the distance between the external conductor and the first articulated arm and the second articulated arm. Then, the electrical signal corresponding to the smallest distance or the largest change of the distance is selected as the electrical signal representing the distance between the external conductor and the housing of the mechanical equipment or a change of the distance between the external conductor and the housing of the mechanical equipment. For example, if the distance between the external conductor and the sensing electrode on the first articulated arm is smaller than the distance between the external conductor and the sensing electrode on the second articulated arm, then, the electrical signal corresponding to the sensing electrode on the first articulated arm is selected as the electrical signal representing the distance between the external conductor and the housing of the mechanical equipment.

In certain embodiments, after the mechanical equipment detects the proximity of the external conductor and generates at least two electrical signals that represent the distance between the external conductor and the housing of the mechanical equipment or a change of the distance between the external conductor and the housing of the mechanical equipment, the coordinates of the external conductor can also be calculated according to the respective electrical signals representing the distance between the external conductor and the sensing electrode or a change of the distance between the external conductor and the sensing electrode and the coordinates of the corresponding sensing electrode.

The coordinate of the sensing electrode is, for example, the coordinate of the sensing electrode relative to the whole or certain parts of the mechanical equipment in the current state of motion of the mechanical equipment, for example, the coordinate relative to the base of the mechanical equipment. Alternatively, the coordinates of the sensing electrodes can also be spatial coordinates relative to the current motion environment of the mechanical equipment. Optionally, the calculated coordinates of the external conductor can be relative to the coordinates of the whole mechanical equipment or certain parts For example, the sensing electrodes on the first articulated arm and the sensing electrodes on the second articulated arm of the robotic arm type robot both sense the proximity of the external conductor and respectively generate electrical signals representing the distance between the external conductor and the sensing electrode. The coordinate system is established with the base of the mechanical equipment as the center, and the mechanical equipment obtains the respective coordinates of the sensing electrode on the first articulated arm and the sensing electrode on the second articulated arm in the current motion state, according to the electrical signal corresponding to each sensing electrode and the coordinate of the corresponding sensing electrode, the coordinates of the external conductor are calculated.

In certain embodiments, the coordinates and coordinates changes of the external conductor can also be calculated based on the changes in the electrical signals of each sensing electrode, and the trajectory of the external conductor relative to the mechanical equipment can be predicted based on these coordinates and coordinates changes and the movement of the mechanical equipment, It is convenient for the mechanical equipment to take an appropriate way to avoid obstacles according to the running track of the external conductor.

In this embodiment, if it is determined that the approaching speed between the external conductor and the mechanical equipment is less than or equal to the second threshold value, the mechanical equipment can maintain the original motion state. If it is determined that the approaching speed between the external conductor and the mechanical equipment becomes smaller than the second threshold value, the following step S206 can be performed.

S206: the mechanical equipment is controlled to avoid collision with external conductors or reduce strength of collision.

In this embodiment, if the distance between the external conductor and the mechanical equipment is less than the first threshold value; or the approaching speed between the external conductor and the mechanical equipment is greater than the second threshold value, the mechanical equipment can be controlled to avoid collision with external conductors or reduce the strength of collision. For example, mechanical equipment can stop the movement or change the direction of movement to avoid collisions with external conductors, and reduce damage caused by collisions. In certain embodiments, before the mechanical equipment performs obstacle avoidance, It can also determine the specific components of mechanical equipment that need to avoid obstacles, so as to perform obstacle avoidance more accurately.

Figure 4:
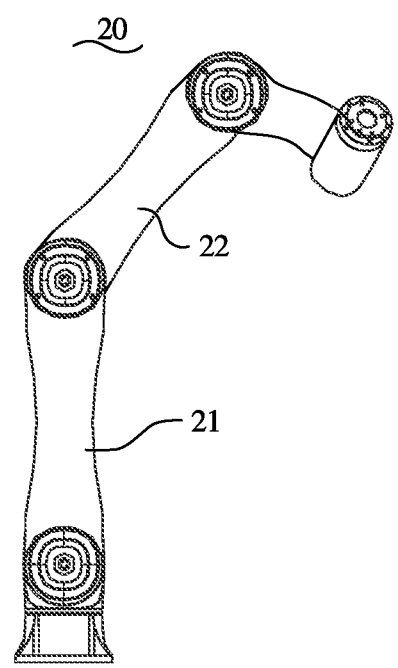
FIG. 4 is a schematic structural diagram of a robot in the first embodiment of the method of avoiding a mechanical equipment from collision with obstacle of the present disclosure.

As shown in FIG. 4, in a specific embodiment, the mechanical equipment can be a robot 20. The robot 20 includes a first moving component 21 and a second moving component 22. One end of the first moving component 21 is connected to one end of the second moving component 22. The first moving component 21 is driven to move and drives the second moving component 22 to move. The second moving part 22 can be driven to swing or rotate relative to the first moving component 21.

When controlling the robot 20 to avoid collision with an external conductor or reduce the strength of collision, it can also be determined between the first moving component 21 and the second moving component 22 which one needs to avoid collision with the external conductor or reduce the strength of collision.

For example, sensing electrodes are respectively distributed on the first moving part 21 and the second moving part 22 of the robot 20, when the robot 20 detects the proximity of an external conductor, it generates an electrical signal that represents the distance between the external conductor and the robot 20, the robot 20 can further determine the position of the sensing electrode that generates the electrical signal, so as to determine the specific moving component of the robot 20 that the external conductor approaches. Alternatively, when the external conductor is approaching multiple moving component at the same time or there are multiple external conductors is approaching the robot 20 to generate multiple electrical signals, the distance between the robot 20 and the external conductor represented by each electrical signal can be calculated based on the electrical signals, and select the moving component with the shortest distance from the external conductor as the moving component that needs to avoid collision or reduce the strength of collision with the external conductor.

If the first moving component 21 needs to avoid collision or reduce the strength of collision with the external conductor, then the first moving component 21 can be controlled to avoid collision or reduce the strength of collision with the external conductor, and stop driving the second moving component 22 or drive the second moving component 22 gradually slowed down to zero speed.

In this embodiment, when it is determined that the moving component that needs to avoid collision or reduce the strength of collision with the external conductor is the first moving component 21, the first moving component can be controlled to decelerate or change the direction of movement to avoid collision or reduce the strength of collision with the external conductor, and at the same time, it can stop driving the second moving component 22 or drive the second moving component 22 to decelerate to zero speed. In this embodiment, the deceleration of the second moving component 22 to zero speed can be that the second moving component 22 is decelerated to zero speed relative to the first moving component 21, that is, the second moving component 22 can be made to be stationary relative to the first moving component 21. For example, when the first moving component 21 avoids collision with the external conductor by getting away from the external conductor, the robot 20 can drive the second moving component 22 to stop moving, and the first moving component 21 drives the relatively stationary second moving component 22 to bypass the external conductor, thereby effectively avoiding obstacles.

If the second moving component 22 needs to avoid collision or reduce the strength of collision with the external conductor, then driving the first moving component 21 is stopped so that it gradually decelerates to zero speed or moves away from the external conductor, and at the same time, based on the action of the first moving component 21, the movement path of the second moving component 22 to avoid collision or reduce the strength of collision with the external conductor is calculated, and the second moving component 22 is controlled to move or stop moving according to the moving path.

In this embodiment, since the movement of the second moving component 22 is realized by combining the movement of the first moving component 21 and its own movement, when it is determined that the moving component that needs to avoid collision or reduce the strength of collision with the external conductor is the second moving component 22, it can be controlled from the movement of the first moving component 21 and the movement of the second moving component 22. For example, the robot 20 can drive the first moving component 21 to move away from the external conductor, and calculate the movement path of the second moving component 22 based on the movement of the first moving component 21, and drive the second moving component 22 to move along the calculated movement path, so that the second moving component 22 avoids collision or reduces the strength of collision with the external conductor.

In some embodiments, S206 can also include: driving the mechanical equipment to decelerate or turn at the maximum deceleration to contact the external conductor.

In this embodiment, the maximum deceleration is, for example, the deceleration at which the driving component of the mechanical equipment can drive the moving component from the highest speed to zero speed in the shortest time. The mechanical equipment can decelerate at maximum deceleration to contact the external conductor. For example, when the mechanical equipment determines that the distance between the external conductor and the mechanical equipment is less than the first threshold value or the approaching speed is greater than the second threshold value, it will decelerate at the maximum deceleration in the direction of current movement, the deceleration of mechanical equipment can greatly reduce the strength of collision with external conductors, and reduce the damage or personal injury caused by high-speed collisions.

In this embodiment, it can also drive the mechanical equipment to turn at the maximum deceleration to contact the external conductor. For example, when the mechanical equipment determines that the distance between the external conductor and the mechanical equipment is less than the first threshold value or the approaching speed is greater than the second threshold value, it decelerates at the maximum deceleration, and turns by a certain angle along the direction of current movement. Mechanical equipment can avoid frontal collisions with external conductors after turning, reduce the collision area, and effectively reduce collisions with some sharp objects, thereby reducing the damage of mechanical equipment.

After the mechanical equipment contacts the external conductor, the mechanical equipment is driven to push away the external conductor at a small deceleration, and then continue to move.

In this embodiment, the small deceleration is smaller than the maximum deceleration. After the mechanical equipment is in contact with the external conductor, it can also push the external conductor away with a small deceleration, to clear some obstacles in the direction of movement of mechanical equipment. For example, the mechanical equipment contacts the external conductor after deceleration, pushing the external conductor to offset the movement trajectory of the mechanical equipment. In certain embodiments, if the mechanical equipment cannot push the external conductor away after contacting the external conductor, it can also continue to move around the external conductor.

In this embodiment, when the mechanical equipment detects the proximity of the external conductor, it can generate an electrical signal that represents the distance between the external conductor and the housing of the mechanical equipment or a change of the distance between the external conductor and the housing of the mechanical equipment, and it can effectively determine whether external conductors will hinder mechanical equipment based on the electrical signal, Therefore, the mechanical equipment can avoid obstacles in time, which can not only make the movement of the mechanical equipment more smooth, but also reduce the damage or personal injury caused by the collision of the mechanical equipment with the external conductor, and improve the safety.

The above sequence of S201 to S206 is the sequence of description in this embodiment, and is not limited to the sequence of the method in this embodiment during execution. On the premise that this method can be implemented, some steps can be reversed or performed simultaneously.

Figure 5:
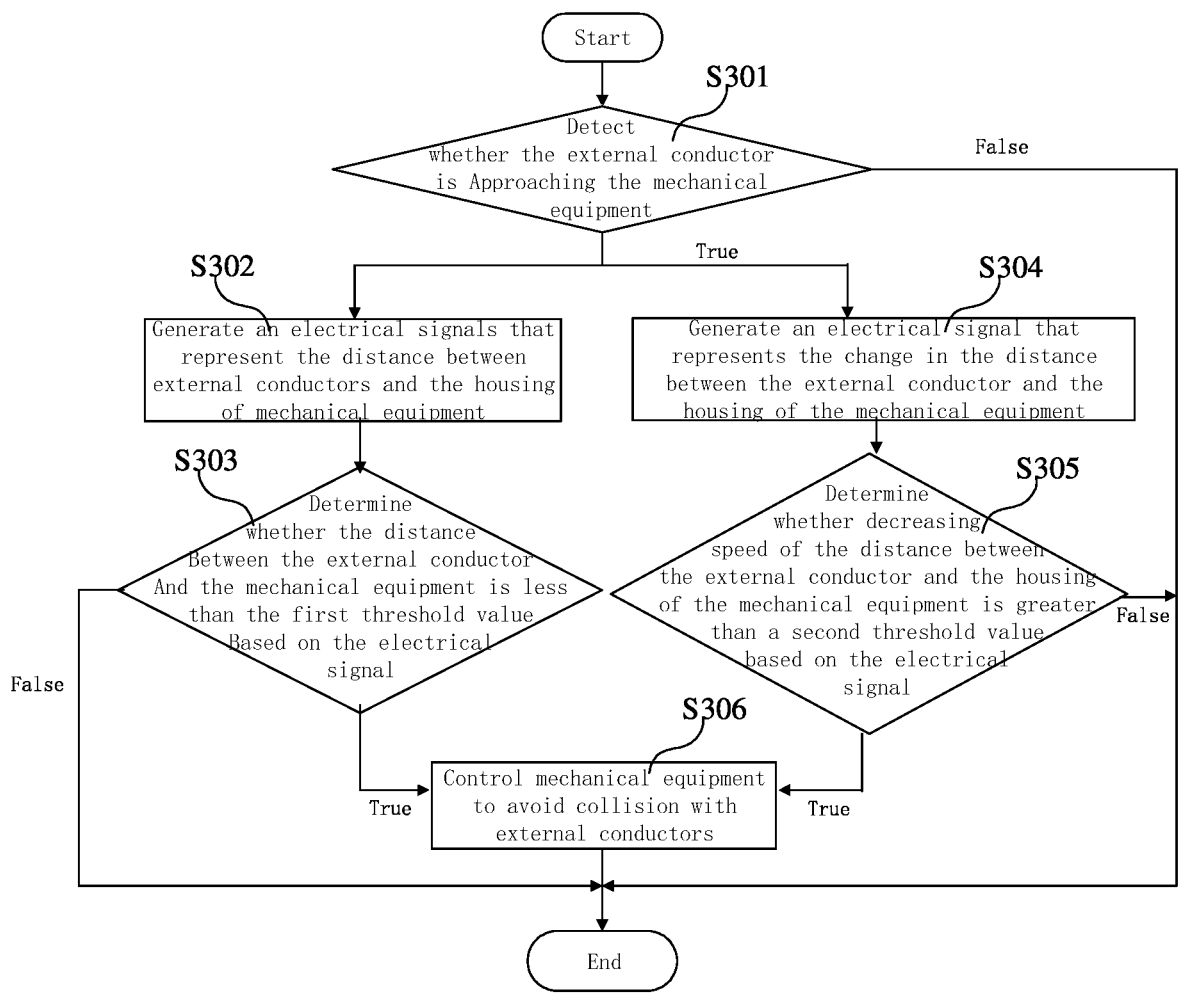
FIG. 5 is a schematic flowchart of the third embodiment of a method of avoiding a mechanical equipment from collision with obstacle of the present disclosure.

Referring to FIG. 5, the third embodiment of the method of avoiding a mechanical equipment from collision with obstacle of the present disclosure is further elaborated on the basis of the second embodiment of the method of avoiding a mechanical equipment from collision with obstacle of the present disclosure, the steps in this embodiment are the same as those in the second embodiment of the method of avoiding a mechanical equipment from collision with obstacle of the present disclosure will not be repeated here. This embodiment includes:

S301: it is detected whether the external conductor is approaching the mechanical equipment.

S302: an electrical signal is generated that represents the distance between the external conductor and the housing of the mechanical equipment.

In this embodiment, when the mechanical equipment detects that the external conductor is approaching the mechanical equipment, it can generate an electrical signal that represents the distance between the external conductor and the housing

S303: it is determined whether the distance between the external conductor and the mechanical equipment is less than a first threshold value based on the electrical signal.

In this embodiment, if it is determined that the distance between the external conductor and the mechanical equipment is less than the first threshold value, perform the following steps of S306.

S304: an electrical signal is generated that represents the change in the distance between the external conductor and the housing.

In this embodiment, when the mechanical equipment detects that the external conductor is approaching the mechanical equipment, it can also generate an electrical signal that represents the change in the distance between the external conductor and the housing.

S305: based on the electrical signal, it is determined whether the approaching speed between the external conductor and the mechanical equipment is greater than a second threshold value.

In this embodiment, if it is determined that the approaching speed between the external conductor and the mechanical equipment is greater than the second threshold value, the following steps of S306 is performed.

S306: the mechanical equipment is controlled to avoid the mechanical equipment from collision with external conductors.

In this embodiment, when it is determined that the distance between the external conductor and the mechanical equipment is less than the first threshold value or the approaching speed is greater than the second threshold value, the mechanical equipment can be controlled to avoid the mechanical equipment from collision with the external conductor.

In this embodiment, the mechanical equipment can be controlled to gradually decelerate to zero speed to avoid collision with external conductors. For example, when the mechanical equipment detects the proximity of the external conductor during the movement, and determines that the distance between the external conductor and the mechanical equipment is less than the first threshold value or the approaching speed is greater than the second threshold value, the mechanical equipment is controlled to decelerate at a predetermined deceleration until the mechanical equipment decelerates to zero and stop the movement. In certain embodiments, the predetermined deceleration can also be adjusted according to the state of the mechanical equipment. For example, the mechanical equipment can calculate the distance to the external conductor based on the electrical signal, and set the corresponding predetermined deceleration based on the distance and the current movement speed of the mechanical equipment, so that the mechanical equipment will not collide with the external conductor when it decelerates to the speed of zero at the predetermined deceleration. Adjusting and controlling the deceleration of the mechanical equipment according to the actual situation so as to make the movement of the mechanical equipment smoother, can effectively reduce the collision between the mechanical equipment and the external conductor, and can also reduce the wear of the moving component of the mechanical equipment caused by emergency braking.

In this embodiment, controlling the mechanical equipment to avoid collision with external conductors can also be achieved by stopping the driving of the mechanical equipment, so that the speed of the mechanical equipment is reduced to zero without driving force. For example, when the mechanical equipment determines that the distance between the external conductor and the mechanical v is less than the first threshold value or the approaching speed is greater than the second threshold value, the mechanical equipment stops driving, such as stopping the driving by controlling the driving component, or stop the movement of mechanical equipment by disconnecting the power supply of the moving component. After stopping the driving of the mechanical equipment, the speed of the mechanical equipment gradually decreases to zero speed without driving force and stops moving, thereby avoiding collision with external conductors.

Alternatively, in this embodiment, the mechanical equipment can also be controlled to bypass the external conductor to avoid collision with the external conductor. For example, during the movement of the mechanical equipment, if it is determined that the external conductor is close and the distance between the external conductor and the mechanical equipment is less than the first threshold value or the approaching speed is greater than the second threshold value, it can change the direction of movement of mechanical equipment so that the mechanical equipment can bypass the external conductor. In certain embodiments, the mechanical equipment can continue to move in the original direction of movement after getting away from the external conductor. By getting away from the external conductor, it can effectively avoid collision with external conductors, thereby making the movement of mechanical equipment more smooth.

In some embodiments, controlling the mechanical equipment to bypass the external conductor may include: controlling the mechanical equipment to use at least one of fuzzy rule method, genetic algorithm, neural network, simulated annealing algorithm, ant colony optimization algorithm, RRT path planning algorithm or RRT random generated number method to bypass the external conductor.

In certain embodiments, when the mechanical equipment gets away from the external conductor, it can also drive the mechanical equipment to bypass the external conductor by a predetermined action. The predetermined action is, for example, the movement mode of the moving component of the mechanical equipment, such as retracting, extending, moving up, moving down, turning or other actions, and a combination of multiple actions. By avoiding external conductors with predetermined actions, the response speed of mechanical equipment can be accelerated. There can be one or more predetermined actions. When there are multiple predetermined actions, the mechanical equipment can select appropriate predetermined action according to the actual situation of the movement to bypass the external conductor, which is more conducive to the mechanical equipment to avoid obstacles reasonably and efficiently. In certain embodiments, the mechanical equipment can also decelerate when performing a predetermined action, so as to avoid unpredictable movements of external conductors causing a strong collision.

Figure 6:
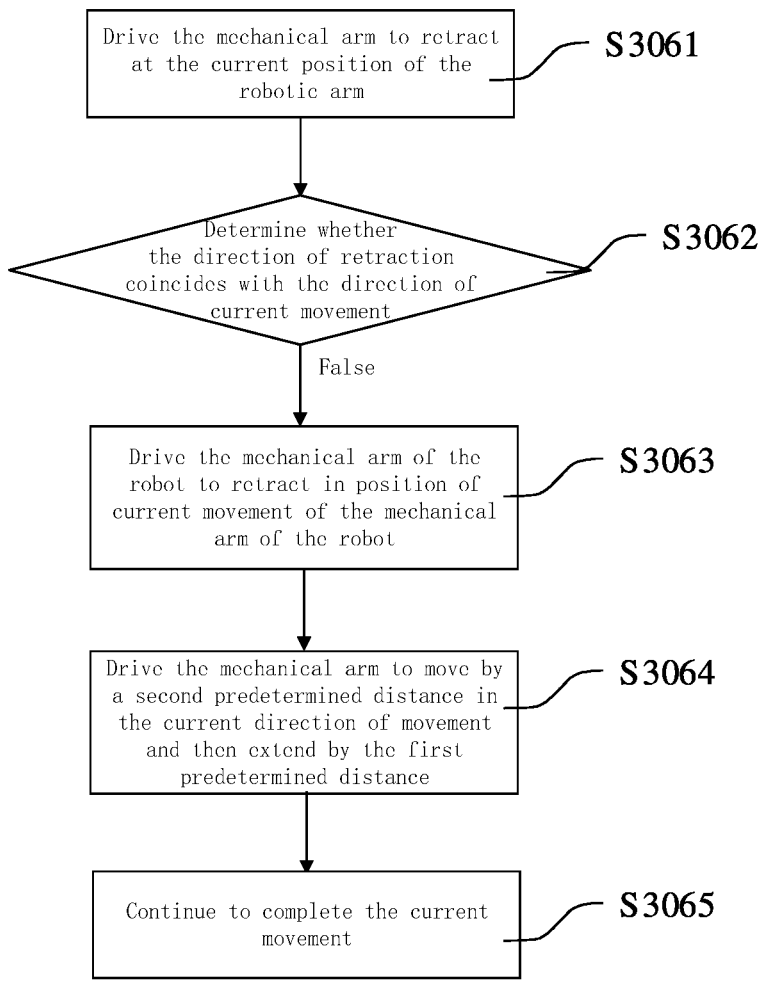
FIG. 6 is a schematic flowchart of another mode of the method of avoiding a mechanical equipment from collision with obstacle of the present disclosure.

In certain embodiments, the mechanical equipment is a mechanical arm type robot, when the mechanical arm of the robot gets away from the external conductor with a predetermined action, as shown in FIG. 6, it can also include the following steps:

S3061: the mechanical arm is driven to retract at the current movement position of the mechanical arm.

In this embodiment, the current movement position of the mechanical arm refers to the position of the mechanical arm in the current movement state, for example, it is the position when the mechanical arm moves relative to the external conductor when it detects that the external conductor is approaching and starts to retract. The mechanical arm can be moving, approaching the external conductor during the movement; alternatively, the mechanical arm can also be in a stopped state, and the external conductor moves and approaches the mechanical arm.

The retracting of the robotic arm is, for example, the movement of the mechanical arm toward the axis of the entire robot, so as to reduce the length of the extension of the end of the mechanical arm. Retracting the mechanical arm can increase the distance to the external conductor, so as to avoid collision with the external conductor. In certain embodiments, the mechanical arm can move in the axial direction so that the end of the mechanical arm retracts in a straight line. Alternatively, the movement of the mechanical arm in the axial direction can also make the end of the mechanical arm to retract in a curve; or it can also be retracted in a predetermined direction.

In some embodiments, the current movement of the robot can also be stopped before driving the mechanical arm to retract. For example, when the base of the robot is in a fixed state, stopping the current movement of the robot can be stopping the movement of the mechanical arm; or the robot is moving, stopping the current movement of the robot can be stopping the current movement of the mechanical arm and/or stopping the overall movement of the robot. The movement of a mechanical arm type robot is usually multi-dimensional, stopping the current movement of the robot before driving the mechanical arm to retract can make the mechanical arm retracting obstacle avoidance more accurate, and can respond more quickly and timely when faced with complex situations, which is helpful for the robot to avoid obstacles efficiently and accurately.

S3062: it is determined whether the direction of retraction coincides with the direction of the current movement.

In this embodiment, whether the direction of retraction coincides with the direction of current movement refers to whether the straight line at the start point and the end point of the retraction of the mechanical arm coincides with the straight line where the direction of movement of the mechanical arm before retraction. In this embodiment, the direction of current movement can be the movement direction of the mechanical arm relative to the external conductor. For example, when the mechanical arm is moving, the direction of current movement can be the direction of the mechanical arm relative to the external conductor when mechanical arm is approaching the external conductor during the movement; alternatively, the mechanical arm can also be in a stop movement state, and the direction of current movement can be the movement direction of the mechanical arm relative to the external conductor when the external conductor moves and approaches the robot arm.

In certain embodiments, if it is determined that the retracted direction of the mechanical arm coincides with the direction of current movement, the mechanical arm retracted can change the direction of movement to avoid the external conductor or stop moving to avoid collision with the external conductor.

In this embodiment, if it is determined that the retracted direction of the mechanical arm does not coincide with the direction of current movement, the following steps S3063 is performed.

S3063: the mechanical arm is driven to retract by a first predetermined distance and then the mechanical arm is further driven to move in the current direction.

In this embodiment, when it is determined that the retracted direction of the mechanical arm does not coincide with the direction of current movement, after the mechanical arm is driven to retract by the first predetermined distance, the mechanical arm is further driven to move in the current direction. The first predetermined distance is, for example, the distance that the end of the robot arm moves. The first predetermined distance can be preset, or can also be determined according to the movement state of the mechanical arm. For example, when driving the mechanical arm to retract, the corresponding first predetermined distance can be set according to the current state of the mechanical arm relative to the external conductor and the current position of the mechanical arm, so that the mechanical arm is retracted by the first predetermined distance, it can avoid collision with external conductors.

Figure 7:
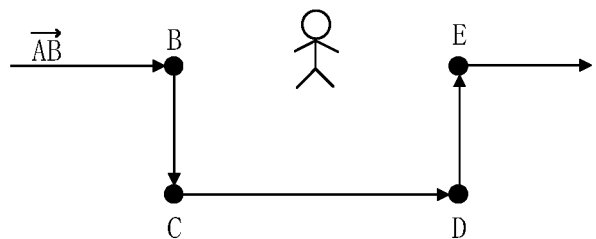
FIG. 7 is a schematic diagram of the movement of the robot arm in another mode of the method of avoiding a mechanical equipment from collision with obstacle of the present disclosure.

As shown in FIG. 7, the solid arrow in the figure shows the actual movement direction and path of the mechanical arm. The mechanical arm moves in the direction of current movement in the direction of AB to the position of the current movement, such as the position of point B, after encountering an external conductor such as a human body, the robot arm retracts by a first predetermined distance BC to reach the position of point C, and then continues to move in the direction of the current movement, getting away from the external conductor.

S3064: the mechanical arm is driven to move by a second predetermined distance in the direction of current movement and then move outwards by the first predetermined distance.

In this embodiment, the second predetermined distance can be preset, or can also be determined according to the movement state of the mechanical arm and the shape and position of the external conductor. After the mechanical arm moves by the second predetermined distance in the direction of current movement, it can move outwards by the first predetermined distance. The extension of the mechanical arm is, for example, the movement of the mechanical arm away from the entire axis of the robot, so that the extended length of the end of the mechanical arm is increased. In this embodiment, after the mechanical arm moves outwards by the first predetermined distance, the end of the mechanical arm can return to the pre-movement trajectory.

As shown in FIG. 7, after the mechanical arm moves to the position of point C, it moves by the second predetermined distance CD to the position of point D in the direction of current movement, and then the robot arm moves outwards by the first predetermined distance DE (equivalent to BC distance) to reach the position of point E, so that the end of the robotic arm returns to the pre-movement trajectory, so that the mechanical arm can continue to move in the direction of current movement.

S3065: it is continued to complete the current movement.

In this embodiment, the mechanical arm can continue to complete the current movement after getting away from the external conductor.

In this embodiment, when a mechanical arm type robot encounters an external conductor approaching, It can quickly avoid external conductors by retracting the mechanical arm, thereby effectively protecting the mechanical arm from damage caused by collisions, and after retracting, continue to move by a certain distance and then move outwards, so that the mechanical arm can bypass the external conductor and return to the pre-movement trajectory, ensuring that the mechanical arm can complete the pre-set movement.

Figure 8:
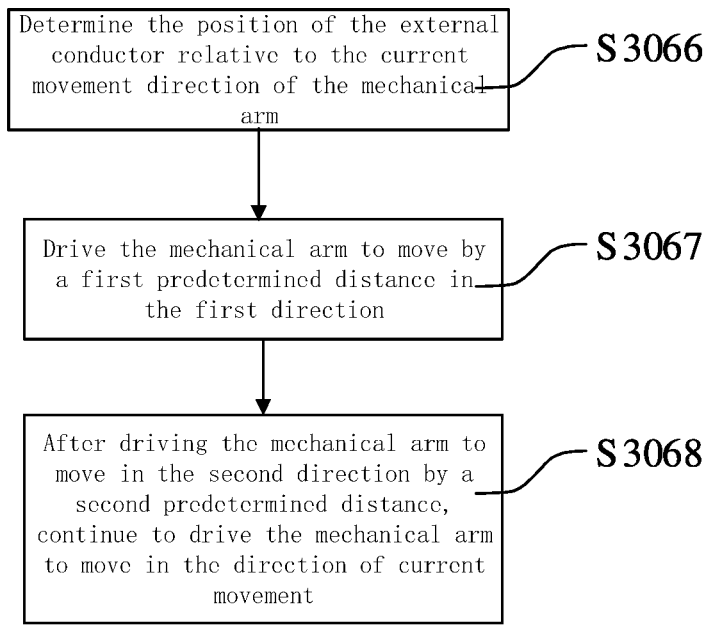
FIG. 8 is a schematic flowchart of another mode of the method of avoiding a mechanical equipment from collision with obstacle of the present disclosure.

In other embodiments, the mechanical arm can also bypass the external conductor by changing the direction of movement, as shown in FIG. 8, for example, including the following steps:

S3066: it is determined the position of the external conductor relative to the direction of current movement of the mechanical arm.

In this embodiment, the direction of the current movement of the mechanical arm can refer to the description of S2062 above. In this embodiment, when the robot arm encounters the approach of an external conductor, it can determine the position of the external conductor relative to the direction of the current movement of the mechanical arm. For example, when the mechanical arm detects the proximity of an external conductor, the change of the sensing circuit closest to the external conductor is caused, and then the mechanical arm generates the corresponding electrical signal, by positioning the position of the sensing circuit that generates the electrical signal, the mechanical arm can determine the position of external conductor relative to the mechanical arm, and determine the relative position of the external conductor in the direction of the current movement of the mechanical arm combining the direction of current movement of the mechanical arm and the change in the distance between the external conductor and the housing of the mechanical equipment.

S3067: the mechanical arm is driven to move by the first predetermined distance in the first direction.

In this embodiment, the first direction is far away from the position of the external conductor and has the first angle with the direction of current movement. The first angle is the angle between the first movement direction and the direction of the current movement. The first angle can be selected from 1 to 90°. The mechanical arm encounters the approach of the external conductor during the movement, and after determining the position of the external conductor relative to the current movement direction of the mechanical arm, it drives the mechanical arm to a position away from the external conductor and offsets a certain angle to continue moving. The first predetermined distance is, for example, the distance that the end of the mechanical arm moves. The first predetermined distance can be determined according to the respective shape and movement state of the external conductor and the mechanical arm.

Figure 9:
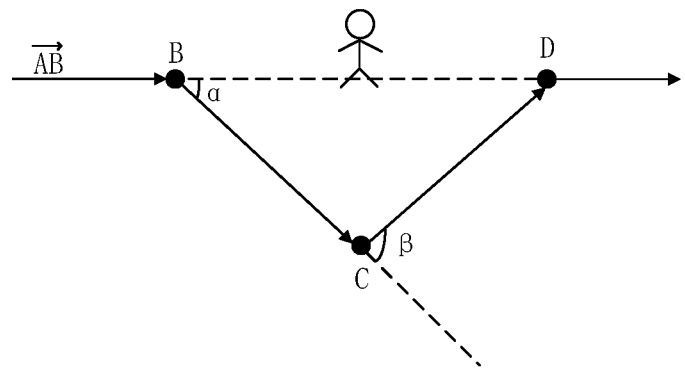
FIG. 9 is a schematic diagram of the movement of the robot arm in another mode of the method of avoiding a mechanical equipment from collision with obstacle of the present disclosure.

As shown in FIG. 9, the solid arrow in the figure shows the movement direction and path of the mechanical arm, and the dashed line shows the extension of the movement direction. When the robot arm moves in the direction of AB to the position of point B, it encounters an external conductor such as a human body, When the external conductor is located above the direction of current movement of the mechanical arm, the robotic arm driven to deflect downward by the first angle α to the lower side of the direction of current movement and continue to move by the first predetermined distance BC, to reach the position of point C to avoid external conductors.

The first predetermined distance in this embodiment is different from the "first predetermined distance" in the embodiment described in S3061 to S3065.

S3068: the mechanical arm is driven to move by the second predetermined distance and in the second direction then the mechanical arm is further driven to move in the direction of current movement.

In this embodiment, the second movement direction is biased toward the direction of current movement and have a second angle with the first movement direction. The second angle is the angle between the second movement direction and the first movement direction. The second angle can be selected from 1 to 90°. After the mechanical arm moves by the first predetermined distance in the first direction, it deflects to the direction of current movement by the second angle, so that the mechanical arm can return to the direction of current movement to continue moving.

As shown in FIG. 9, after the mechanical arm moves by the first predetermined distance BC in the first direction, it deflects a second angle β in the direction of current movement, and reaches the position of point D after moving by the second predetermined distance CD, returns to the current direction of the movement, and continue to complete the current movement.

In this embodiment, when the robotic arm robot is approaching an external conductor, it can effectively avoid the external conductor by changing the direction of movement twice, thereby reducing mechanical arm damage caused by collision, and moving more smooth, and the robotic arm is moving around, in addition, the mechanical arm can return to the pre-movement trajectory after getting away from the external conductor, ensuring that the mechanical arm can complete the pre-movement.

The second predetermined distance in this embodiment is different from the "second predetermined distance" in the embodiment described in S3061 to S3065.

The above steps S3061 to S3065 and S3066 to S3068 are mutually independent steps, which can be executed separately or simultaneously, and the execution order is not limited.

In this embodiment, when the mechanical equipment detects the proximity of an external conductor, by generating an electrical signal that represents the distance between the external conductor and the housing of the mechanical equipment or a change of the distance between the external conductor and the housing of the mechanical equipment, the mechanical equipment can effectively determine based on the electrical signal whether the external conductor will hinder mechanical equipment. Therefore the mechanical equipment can respond in time when it is necessary to avoid collisions. In this embodiment, the mechanical equipment is controlled to avoid the mechanical equipment from collisions with external conductors, which not only makes the movement of the mechanical equipment smoother, but also greatly reduce damage or personal injury caused by collisions between mechanical equipment and external conductors, thereby improving safety.

The above sequence of S301 to S306 is the sequence of description in this embodiment, and is not limited to the sequence of the method in this embodiment during execution. On the premise that this method can be implemented, some steps can be reversed or performed simultaneously.

Figure 10:
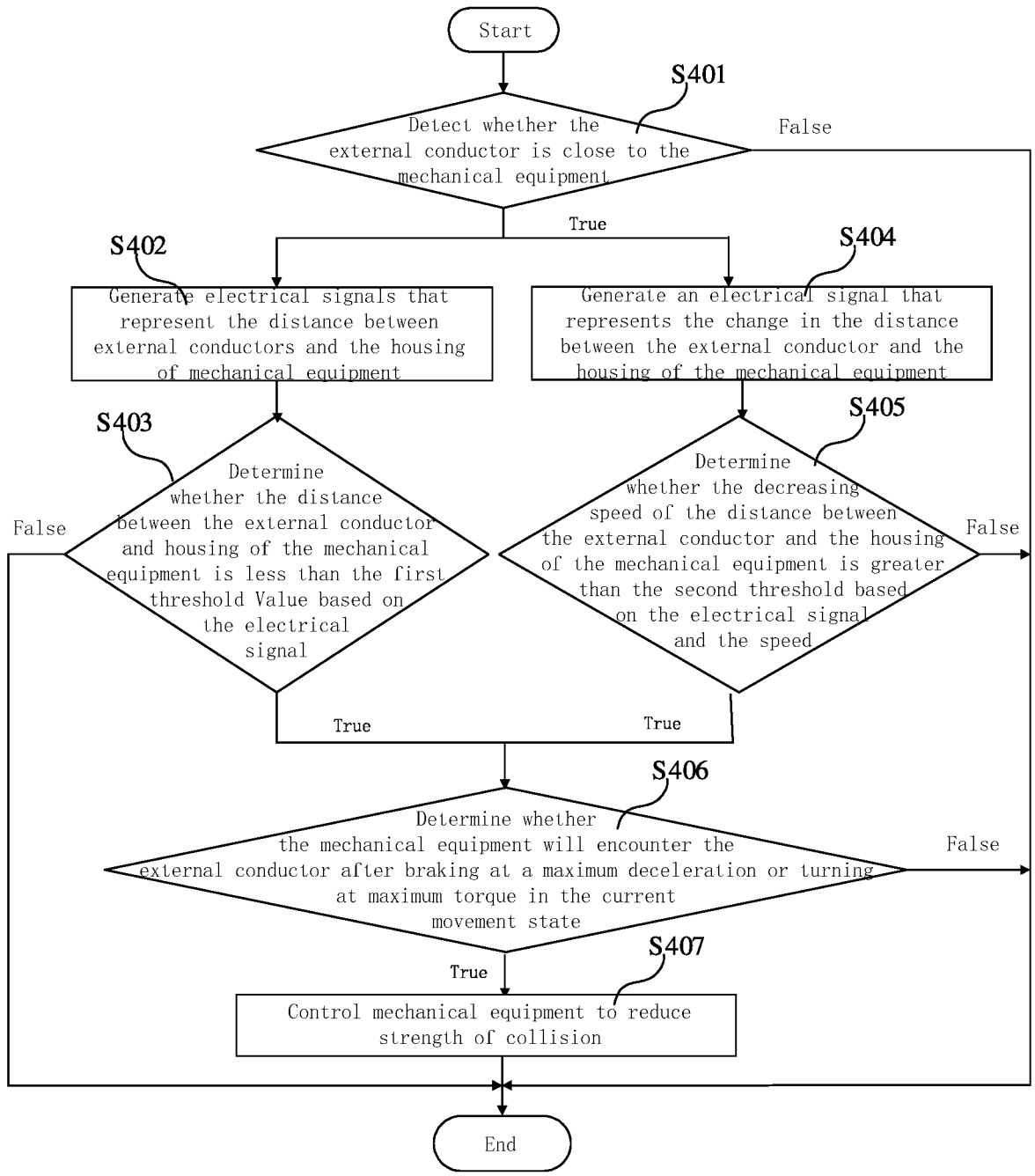
FIG. 10 is a schematic flowchart of the fourth embodiment of a method of avoiding a mechanical equipment from collision with obstacle of the present disclosure.

Referring to FIG. 10, the fourth embodiment of the method of avoiding a mechanical equipment from collision with obstacle of the present disclosure is further elaborated on the basis of the second embodiment of the method of avoiding a mechanical equipment from collision with obstacle of the present disclosure. The steps in this embodiment are the same as those in the second embodiment of the method of avoiding a mechanical equipment from collision with obstacle of the present disclosure and will not be repeated here. This embodiment includes:

S401: it is detected whether the external conductor is approaching the mechanical equipment.

S402: an electrical signal is generated that represents the distance between the external conductor and the housing of the mechanical equipment.

In this embodiment, when the mechanical equipment detects that the external conductor is approaching the mechanical equipment, it can generate an electrical signal that represents the distance between the external conductor and the housing S403: it is determined whether the distance between the external conductor and the mechanical equipment is less than a first threshold value based on the electrical signal.

In this embodiment, if it is determined that the distance between the external conductor and the mechanical equipment is less than the first threshold value, the following steps of S406 or S407 are performed.

S404: an electrical signal is generated that represents the change in the distance between the external conductor and the housing.

In this embodiment, when the mechanical equipment detects that the external conductor is approaching the mechanical equipment, it can also generate an electrical signal that represents the change in the distance between the external conductor and the housing.

S405: it is determined based on the electrical signal whether the approaching speed between the external conductor and the mechanical equipment is greater than the second threshold value.

In this embodiment, if it is determined that the approaching speed between the external conductor and the mechanical equipment is greater than the second threshold value, the following steps of S406 or S407 are performed.

S406: it is determined whether the mechanical equipment will encounter an external conductor after braking at maximum deceleration or turning at maximum torque in the current movement state.

In this embodiment, the current movement state of the mechanical equipment includes, for example, the direction, speed, and position of the current movement of the mechanical equipment. The maximum deceleration is, for example, the deceleration when the mechanical equipment decelerates from the maximum movement speed to zero speed in the shortest time. The mechanical equipment can calculate the distance and the approaching speed of the external conductor relative to the mechanical equipment through the electrical signal, and then combine the current movement state of the mechanical equipment, and then determine whether it will encounter the external conductor after braking at the maximum deceleration in the current movement state. The maximum torque is, for example, the maximum torque that can be output by the driving component of the mechanical equipment. Mechanical equipment can turn at the fastest speed when turning at maximum torque.

In certain embodiments, when the external conductor moves approaching the mechanical equipment, the mechanical equipment can determine whether the mechanical equipment will encounter the external conductor after braking at the maximum deceleration or turning at the maximum torque in the current movement state based on the movement state of the external conductor.

For example, S406 can include: predicting the movement path and speed of the external conductor.

In this embodiment, the mechanical equipment can predict the movement path and speed of the external conductor. For example, mechanical equipment can calculate the distance and orientation of the external conductor relative to the current position of the mechanical equipment through the electrical signal that represents the distance between the external conductor and the housing of the mechanical equipment, and the change in distance of the external conductor relative to the mechanical equipment is calculated through the electrical signal that represents the change in the distance between the external conductor and the housing of the mechanical equipment, thereby predicting the movement path and speed of the external conductor.

In this embodiment, it is also possible to combine the movement path and speed of the external conductor and the current movement state of the mechanical equipment to determine whether the mechanical equipment will encounter the external conductor after braking at the maximum deceleration or turning at the maximum torque. For example, mechanical equipment predicts the movement path and speed of the external conductor relative to the mechanical equipment through the electrical signal that represents the distance between the external conductor and the housing of the mechanical equipment or a change of the distance between the external conductor and the housing of the mechanical equipment, and then obtains the current movement state of the mechanical equipment, such as the speed of movement, movement direction, current movement position, etc., and then combines the movement path and speed of the external conductor and the current movement state of the mechanical equipment to calculate whether the mechanical equipment will collide with the external conductor after braking at maximum deceleration or turning at maximum torque.

In this embodiment, if it is determined that the mechanical equipment will not encounter the external conductor after braking at the maximum deceleration or turning at the maximum torque in the current movement state, then, the following steps of controlling the mechanical equipment to decelerate or turn to contact the external conductor and subsequent steps, that is, the steps of S407, are not executed.

If it is determined that the mechanical equipment will encounter an external conductor after braking at the maximum deceleration or turning at the maximum torque in the current motion state, the following steps S407 are performed.

S407: the mechanical equipment is controlled to reduce the strength of collision.

In this embodiment, if it is determined that the mechanical equipment will encounter an external conductor after braking at the maximum deceleration or turning at the maximum torque in the current movement state, the mechanical equipment can be controlled to reduce the strength of collision. Controlling the mechanical equipment to reduce the strength of collision is, for example, controlling the mechanical equipment to reduce the relative movement speed with the external conductor to reduce the strength of collision.

In certain embodiments, S407 includes, for example, controlling the mechanical equipment to decelerate or turn to contact the external conductor.

Controlling the deceleration of the mechanical equipment is, for example, controlling the mechanical equipment to decelerate at a predetermined deceleration. The kinetic energy of the mechanical equipment is reduced after deceleration, and the impact generated when it collides with an external conductor is smaller, thereby effectively reducing the damage to the mechanical equipment caused by the impact during the collision. In certain embodiments, the deceleration of the mechanical equipment can be controlled by the minimum deceleration. Alternatively, it is also possible to combine the movement path and speed of the external conductor and the current movement state of the mechanical equipment to control the mechanical equipment to decelerate at an appropriate deceleration so that the mechanical equipment contacts the external conductor at a certain moving speed.

In this embodiment, the mechanical equipment can also be controlled to turn to contact the external conductor. Controlling the turning of the mechanical equipment is, for example, controlling the mechanical equipment to change the direction of the current movement with a predetermined torque. For example, when a mechanical equipment encounters an external conductor in the direction of current movement, it can turn to the side of the external conductor and make contact with the side of the external conductor, this can avoid a frontal collision with the external conductor, and effectively reduce the impact during collision. And when encountering some external conductors with irregular shapes, contacting with sharp protrusions can be avoided by turning contact, and damage caused by collision can be reduced.

In this embodiment, after contacting the external conductor, the mechanical equipment can also be controlled to push the external conductor to continue moving at a speed that does not damage the external conductor. For example, after contacting an external conductor, a mechanical equipment pushes the external conductor to continue moving in the direction of the current movement of the mechanical equipment to remove some obstacles on the trajectory of the mechanical equipment, thereby making the subsequent movement of the mechanical equipment more smooth. Alternatively, the mechanical equipment can also push the external conductor to a predetermined position, and this method can also be applied to some application scenarios that need to push objects to increase the use and function of the mechanical equipment.

In certain embodiments, if it is determined that the distance between the external conductor and the mechanical equipment is less than the first threshold value or the approaching speed is greater than the second threshold value, the step S407 can also be directly executed.

In this embodiment, when the mechanical equipment detects the proximity of an external conductor, by generating an electrical signal that represents the distance between the external conductor and the housing of the mechanical equipment or a change of the distance between the external conductor and the housing of the mechanical equipment, the mechanical equipment can effectively determine based on the electrical signal whether the external conductor will hinder mechanical equipment, so that the mechanical equipment can quickly respond based on the determination result, the mechanical equipment can also slow down or turn to contact the external conductor, and push the external conductor without harming the external conductor, which can effectively remove certain obstacles in the direction of movement of the mechanical equipment, thereby making the subsequent movement of mechanical equipment more smooth. In addition, it can also be applied to some application scenarios that need to push objects to increase the use and function of mechanical equipment.

The above sequence of S401 to S407 is the sequence of description in this embodiment, and is not limited to the sequence of the method in this embodiment during execution. On the premise that this method can be implemented, some steps can be reversed or performed simultaneously. This embodiment can be combined with the above-mentioned the first to the third embodiments of the present disclosure.

Figure 11:
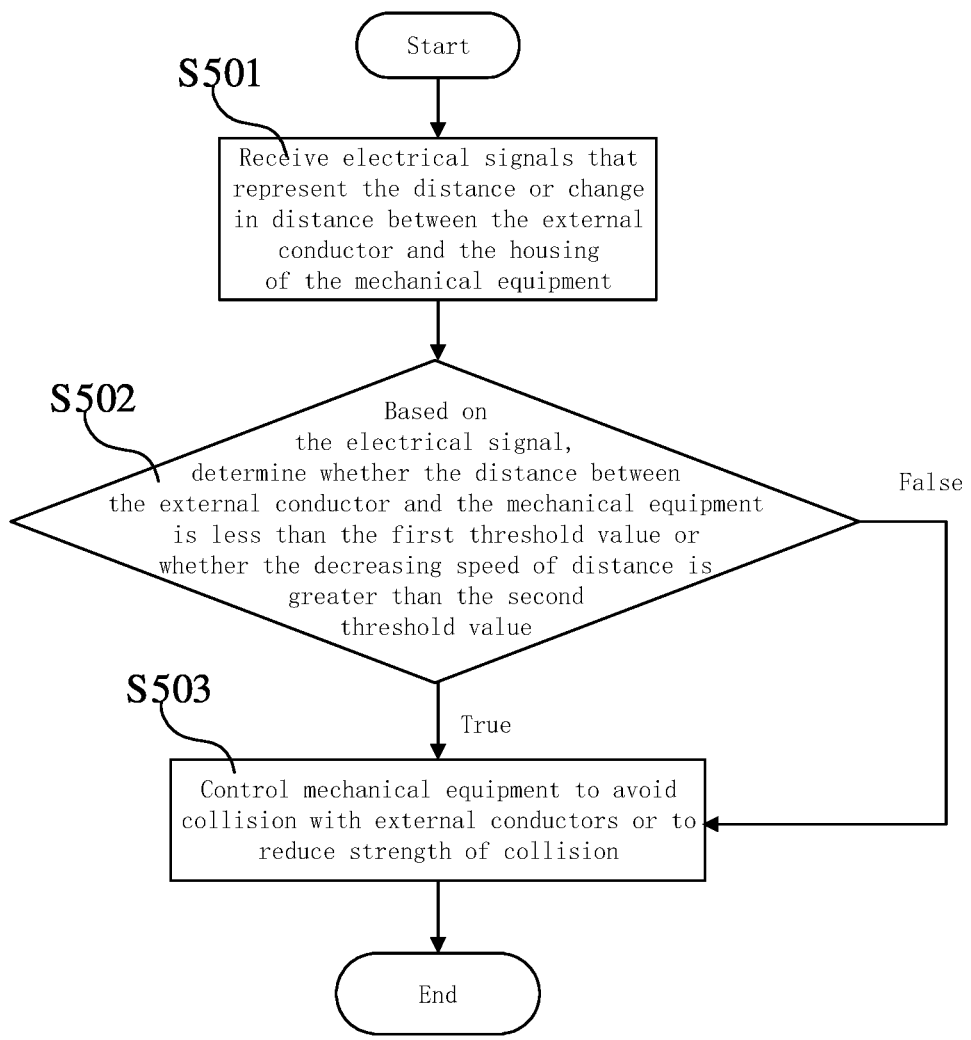
FIG. 11 is a schematic flowchart of the fifth embodiment of a method of avoiding a mechanical equipment from collision with obstacle of the present disclosure.

Referring to FIG. 11, the fifth embodiment of the method of avoiding a mechanical equipment from collision with obstacle of the present disclosure uses the control system of the mechanical equipment as the execution subject, and this embodiment includes:

S501: an electrical signal is received that represents the distance between the external conductor and the housing of the mechanical equipment or a change of the distance between the external conductor and the housing of the mechanical equipment.

In this embodiment, the electrical signal is obtained, for example, by detecting that an external conductor is approaching a mechanical equipment.

S502: based on the electrical signal, it is determined whether the distance between the external conductor and the mechanical equipment is less than the first threshold value or whether the approaching speed is greater than the second threshold value.

In this embodiment, if it is determined that the distance is less than the first threshold or an approaching speed is greater than the second threshold value, the following step S503 can be performed.

S503: the mechanical equipment is controlled to avoid the mechanical equipment from collision with external conductors or reduce strength of collision.

Optionally, controlling the mechanical equipment to avoid collision with external conductors can include: controlling the mechanical equipment to gradually decelerate to zero speed.

Optionally, controlling the mechanical equipment to avoid collisions with external conductors can also include: stopping the driving of the mechanical equipment, so that the speed of the mechanical equipment is reduced to zero speed without driving force.

Optionally, controlling the mechanical equipment to avoid the mechanical equipment from collision with the external conductor can also include: controlling the mechanical equipment to bypass the external conductor.

Optionally, controlling the mechanical equipment to bypass the external conductor can also include: driving the mechanical equipment to bypass the external conductor with a predetermined action.

For more functions and steps of the mechanical equipment control system in this embodiment, it can refer to the description of the first to fourth embodiments of the method of avoiding a mechanical equipment from collision with obstacle of the present disclosure, which will not be repeated here.

Figure 12:
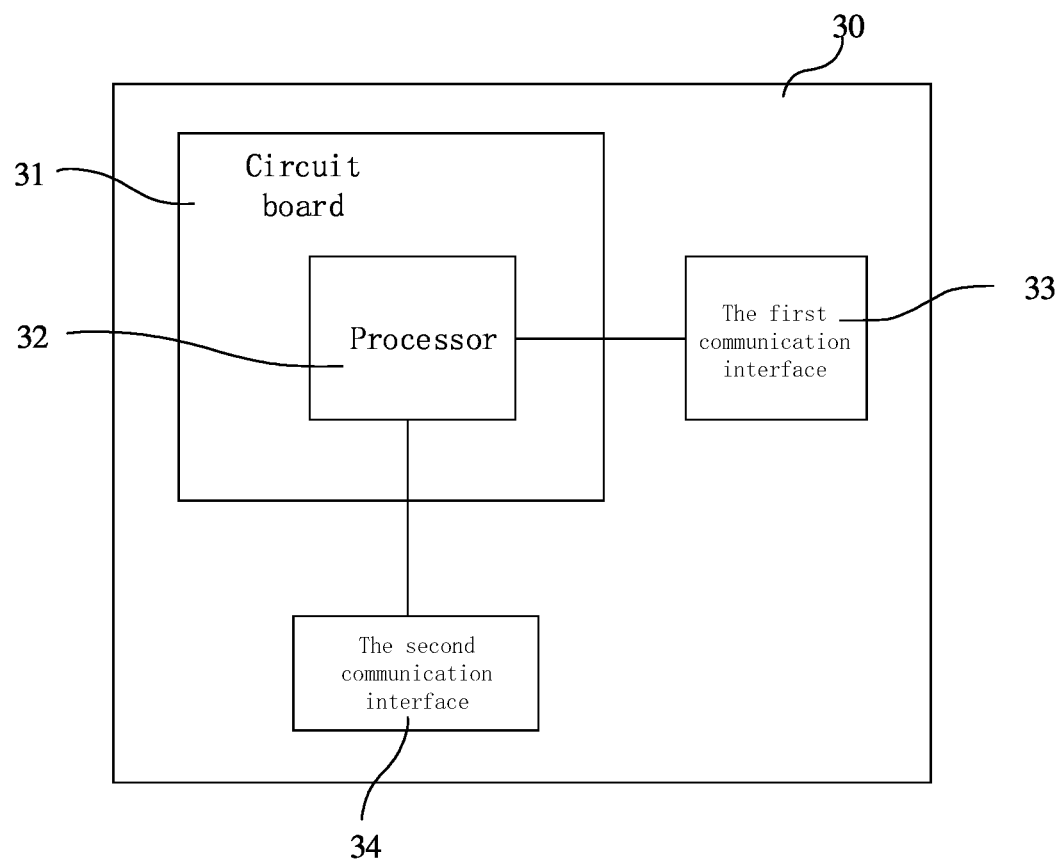
FIG. 12 is a schematic structural view of an embodiment of a controller of a mechanical equipment of the present disclosure.

Referring to FIG. 12, which is a schematic structural diagram of the mechanical equipment controller's embodiment of the present disclosure. The controller 30 includes: a circuit board 31, a processor 32, a first communication interface 33 and a second communication interface 34.

The processor 32 is arranged on the circuit board 31; the first communication interface 33 is configured to be coupled with the electronic skin of the mechanical equipment; the second communication interface 34 is configured to be coupled with the drive components of the mechanical equipment; the processor 32 is configured to execute the above apply for the steps of the fifth embodiment of the method of avoiding a mechanical equipment from collision with obstacle to receive an electrical signal that represents the distance between the external conductor and the housing of the mechanical equipment or a change of the distance between the external conductor and the housing of the mechanical equipment by the first communication interface 33, and sends instructions by the second communication interface 34 to the drive components to control the mechanical equipment to avoid the mechanical equipment from collision with external conductors or to reduce the strength of the collision.

In this embodiment, the first communication interface 33 adopts, for example, wired communication, including but not limited to a serial interface and a parallel interface; alternatively, the first communication interface 33 can also adopt a wireless communication method, for example, including a wireless interface. The second communication interface 34 can also adopt a wired communication method, including but not limited to a serial interface and a parallel interface; alternatively, the second communication interface 34 can also adopt a wireless communication method, for example, including a wireless interface.

In this embodiment, the processor 32 can be an integrated circuit chip with signal processing capability. The processor 32 can also be a general-purpose microprocessor (MCU), a digital signal processor (DSP), an application specific integrated circuit (ASIC), a field programmable gate array (FPGA) or other programmable logic device, discrete gate or transistor logic device, discrete hardware components. The general-purpose processor can be a microprocessor or the processor may also be any conventional processor or the like.

For more functions and steps of the controller 30 of the mechanical equipment in this embodiment, please refer to the description of the fifth embodiment of the method of avoiding a mechanical equipment from collision with obstacle in the present disclosure, which will not be repeated here.

In summary, the mechanical equipment of the present disclosure generates an electrical signal that represents the distance between the external conductor and the housing of the mechanical electrical or a change of the distance between the external conductor and the housing of the mechanical electrical when detecting the proximity of the external conductor, the mechanical equipment can determine the distance between external conductors and mechanical equipment or a change of the distance between external conductors and mechanical equipment based on electrical signals. When an external conductor is found to be approaching the mechanical equipment or when an external conductor such as a human body suddenly appears to be approaching the movement track of the mechanical equipment, the mechanical equipment can take timely measures to avoid the mechanical equipment from collision with the external conductor or to reduce the collision with the external conductor, thereby reducing mechanical equipment damage or personal injury caused by collision, and improving safety.

Figure 13:
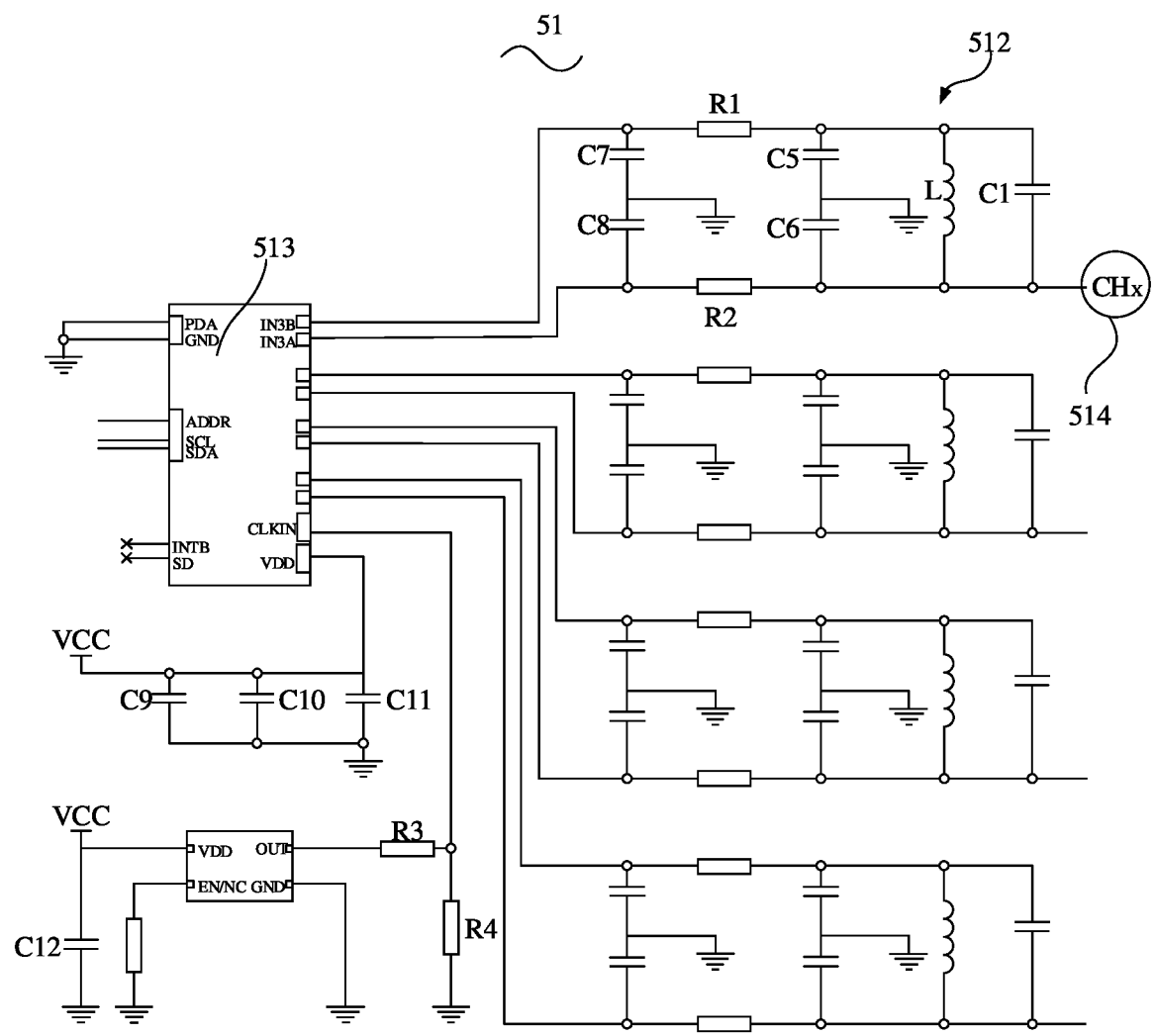
FIG. 13 is a schematic diagram of a circuit structure of a sensing circuit provided by an embodiment of the present disclosure.

The present disclosure can use the following methods to detect whether the external conductor is approaching the mechanical equipment:

Please refer to FIG. 13, which is a schematic diagram of a circuit structure of a sensing circuit provided by an embodiment of the present disclosure. The sensing circuit 51 includes an oscillatory circuit 512, a detection circuit 513, and a connection terminal 514. The oscillatory circuit 512 and the detection circuit 513 are commonly coupled to the connection terminal 514, and the connection terminal 514 is coupled to the electrode 52 of the electronic skin. The oscillatory circuit 512 is coupled to the electrode 52 through the connection terminal 514, and changes its oscillation frequency when the external conductor approaches the electrode 52 to form a capacitance. The detection circuit 513 is coupled to the oscillatory circuit 512, and detects the oscillation frequency of the oscillatory circuit 512 and output an electrical signal representing the oscillation frequency.

In some embodiments, the oscillatory circuit 512 oscillates in a single oscillation manner, and the detection circuit 513 can measure the oscillation frequency of the oscillatory circuit 512.

As shown in FIG. 13, specifically, the oscillatory circuit 512 can include an inductor L and a first capacitor C1, and the inductor L and the first capacitor C1 form an oscillatory circuit. The oscillatory circuit 512 can be an LC parallel resonance circuit 512 or an LC series resonance circuit 512. The oscillatory circuit 512 is coupled to the detecting circuit 513, and the detecting circuit 513 is configured to output an excitation signal to the oscillatory circuit during the oscillation period. Specifically, the excitation signal can be output to the first end of the first capacitor C1 during the oscillation period. The first end of the first capacitor C1 is coupled to the connection terminal 514, and is coupled to the electrode 52 of the electronic skin through the connection terminal 514. Through the above method, the excitation signal output by the detection circuit 513 can be always output to the first end of the first capacitor C1, so that the oscillatory circuit 512 oscillates in a single oscillation mode, and the detection circuit 513 detects the oscillation frequency or frequency variety of the oscillatory circuit 512. Optionally, the capacitance value of the first capacitor C1 is 15-40 pF.

When the distance between the electrode 52 and the external conductor is less than a certain range, the electrode 52 and the external conductor form a second capacitor C2. The second capacitor C2 is connected to the oscillatory circuit 512, thereby changing the equivalent capacitance value of the oscillatory circuit 512, which will change the oscillation frequency of the oscillatory circuit. This change in the oscillation frequency is associated with the second capacitor C2, Since the first capacitor C1 and the inductor L are known, the second capacitor C2 or data related to the distance between the external conductor and the electrode 52 can be calculated.

Figure 14:
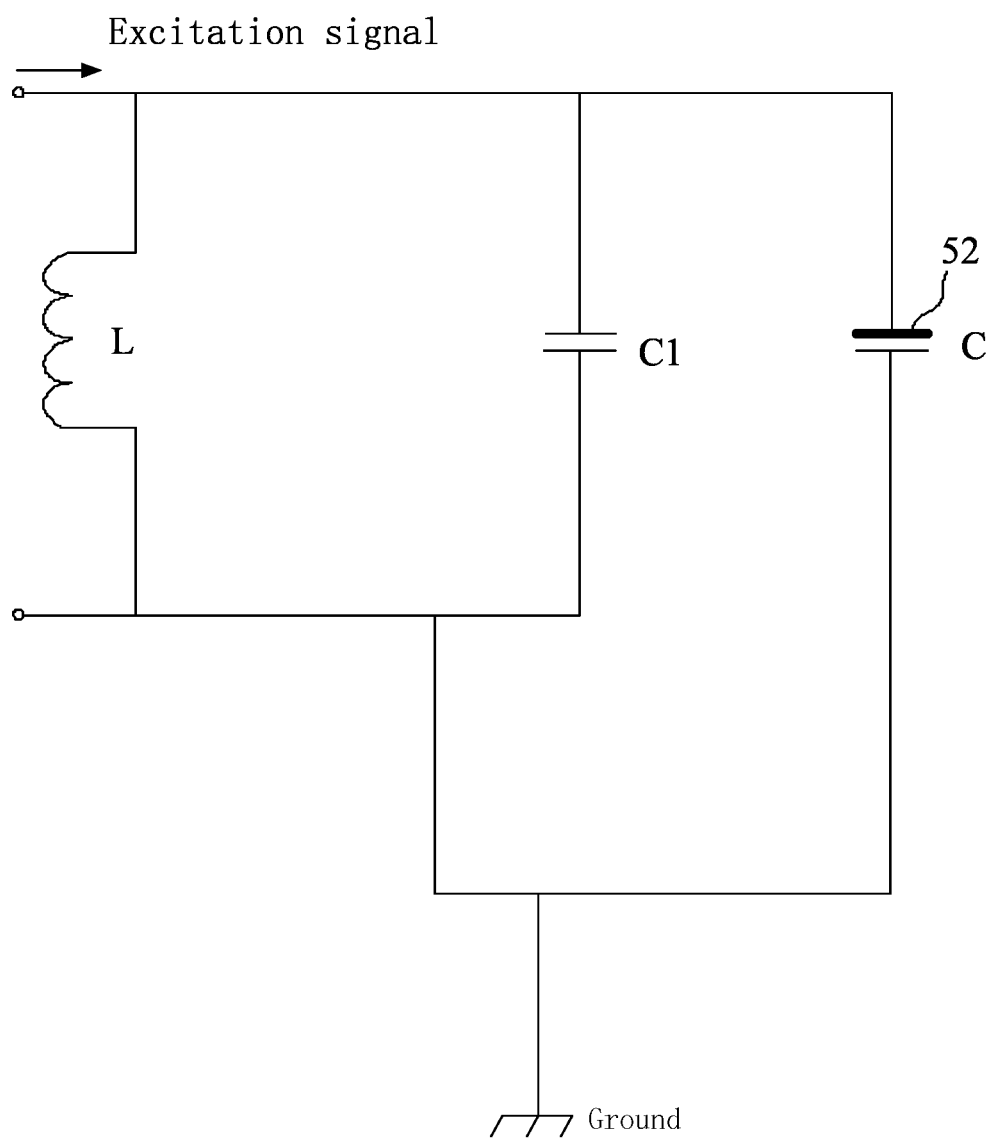
FIG. 14 is a schematic diagram of an equivalent circuit of an oscillatory circuit in a single oscillation mode provided by an embodiment of the present disclosure.

Referring to FIG. 14, FIG. 14 is a schematic diagram of an equivalent circuit of an oscillatory circuit in a single oscillation mode provided by the embodiment of the present disclosure. A case for the single-oscillation implementation is: the second end of the first capacitor C1 is grounded.

The entire oscillation period is: $T=2\pi\sqrt{L(C_1+C_2)}$.

The oscillation frequency detected by the detection circuit 513 is:

$$f_s = \frac{1}{T} = \frac{1}{2\pi\sqrt{L(C_1+C_2)}}.$$

Figure 15:
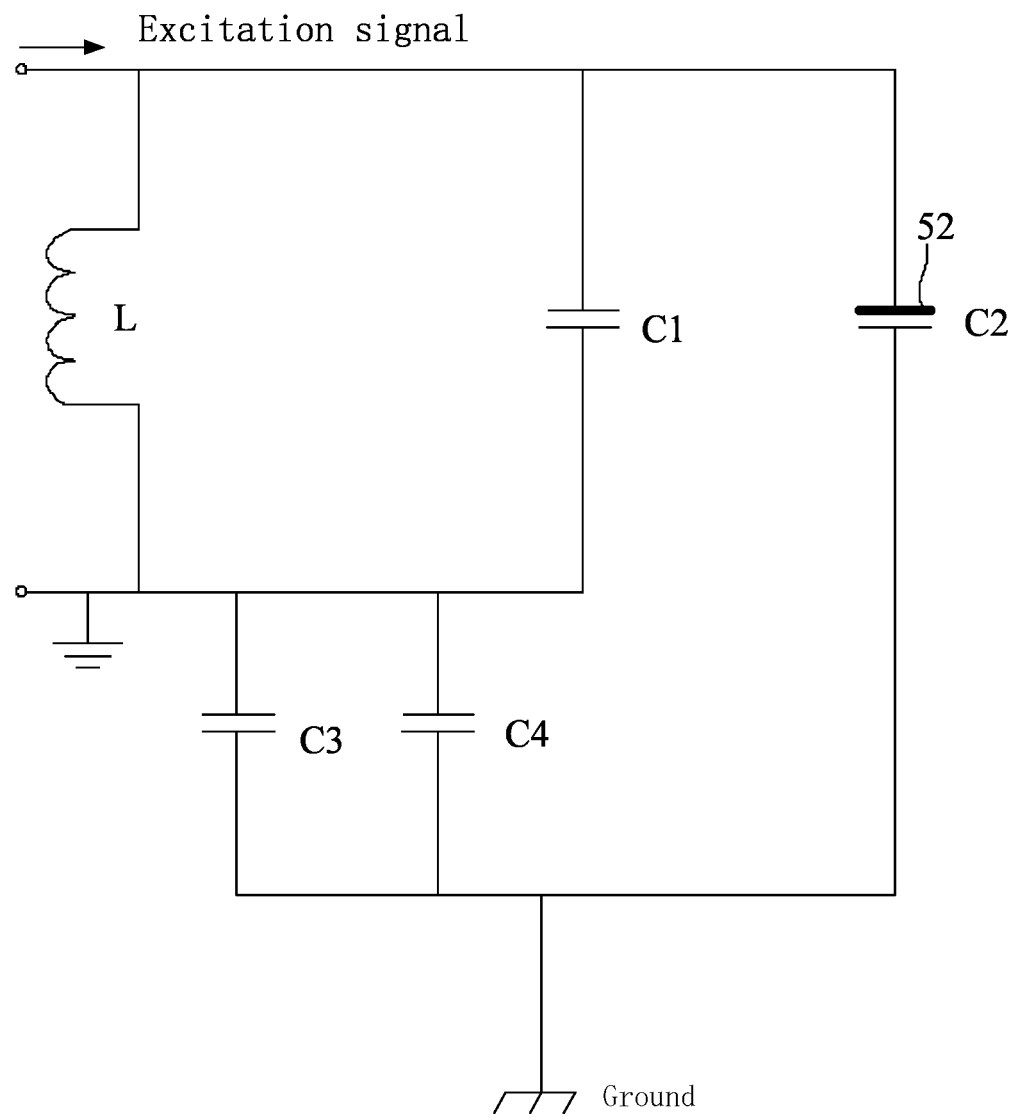
FIG. 15 is a schematic diagram of another equivalent circuit of an oscillatory circuit in a single oscillation mode provided by an embodiment of the present disclosure.

Refer to FIG. 15, FIG. 15 is another equivalent circuit diagram of a single-oscillation mode oscillatory circuit provided by the embodiment of the present disclosure. For another case of the single-oscillation mode implementation, the oscillatory circuit 512 can include the third capacitor C3 and the fourth capacitor C4. The capacitance of the ground of the sensing circuit 51 to the ground constitutes the third capacitance C3. The capacitor coupled to the ground to the mechanical equipment constitutes the fourth capacitor C4. The fourth capacitor C4 is, for example, a capacitor generated when the ground is coupled to the main metal conductor (such as a metal bracket, a joint bracket, or other additional metal plates) of the mechanical equipment, the fourth capacitor C4 is much larger than the third capacitor C3. Because in this manner, the second terminal of the first capacitor C1 is connected to the ground (signal ground), the ground of the sensing circuit 51 can be coupled to the second terminal of the first capacitor C1, or the second terminal of the second capacitor C2 can be used as the ground of the sensing circuit 51. In this embodiment, except for the explicit description of being grounded, the rest of the grounds are coupling signal grounds or power grounds.

For example, the calculation process of the oscillation frequency of the single oscillation in this case can be as follows:

$$C_{comb} = \frac{C_2 C_3}{C_2 + C_3} = \beta C_2$$

$$\beta = \frac{1}{1+\frac{C_2}{C_3}}$$

Since the ground is connected to the metal frame, it is equivalent to connecting a large capacitor in parallel with the third capacitor C3, that is, the third capacitor C3 and the fourth capacitor C4 are connected in parallel, In fact, the equivalent capacitance of the third capacitor C3 is increased. That is, the above formula becomes, $$C_{comb} = \frac{(C_3+C_4) \times C_2}{C_3 + C_4 + C_2} = \beta C_2,$$

$$\beta = \frac{1}{1+\frac{C_2}{C_3+C_4}},$$

therefore the above $\beta \approx 1$.

In the first half of the oscillation period:

$$T_1 = \pi\sqrt{L(C_1 + C_{comb})} = \pi\sqrt{LC_1\left(1+\frac{\beta C_2}{C_1}\right)}.$$

In the second half of the oscillation period: $T_2=T_1$.

The oscillation frequency detected by the detection circuit 513 is:

$$f_s = \frac{1}{2T_1} = \frac{1}{2\pi\sqrt{LC_1\left(1+\frac{\beta C_2}{C_1}\right)}}.$$

Wherein, $T_1$ is the first of the oscillation period, $T_2$ is the second half period of the oscillation period, $C_{comb}$ is the equivalent capacitance, and $\beta$ is the capacitance coefficient.

Since L and C1 are determined, $\beta=1$, and $f_s$ is detected by the detection circuit 513, so fds is also determined, so C2 can be calculated according to the above formula.

In other embodiments, the oscillatory circuit 512 oscillates in a dual oscillation manner, and the detection circuit 513 can measure the oscillation frequency of the oscillatory circuit 512.

The sensing circuit 51 can include a switching circuit, and the switching circuit is coupled to the oscillatory circuit 512. The oscillatory circuit 512 includes an inductor L and a first capacitor C1 forming an oscillatory circuit. The oscillatory circuit 512 can be an LC parallel resonance circuit 512, or an LC series resonance circuit 512.

Figure 16:
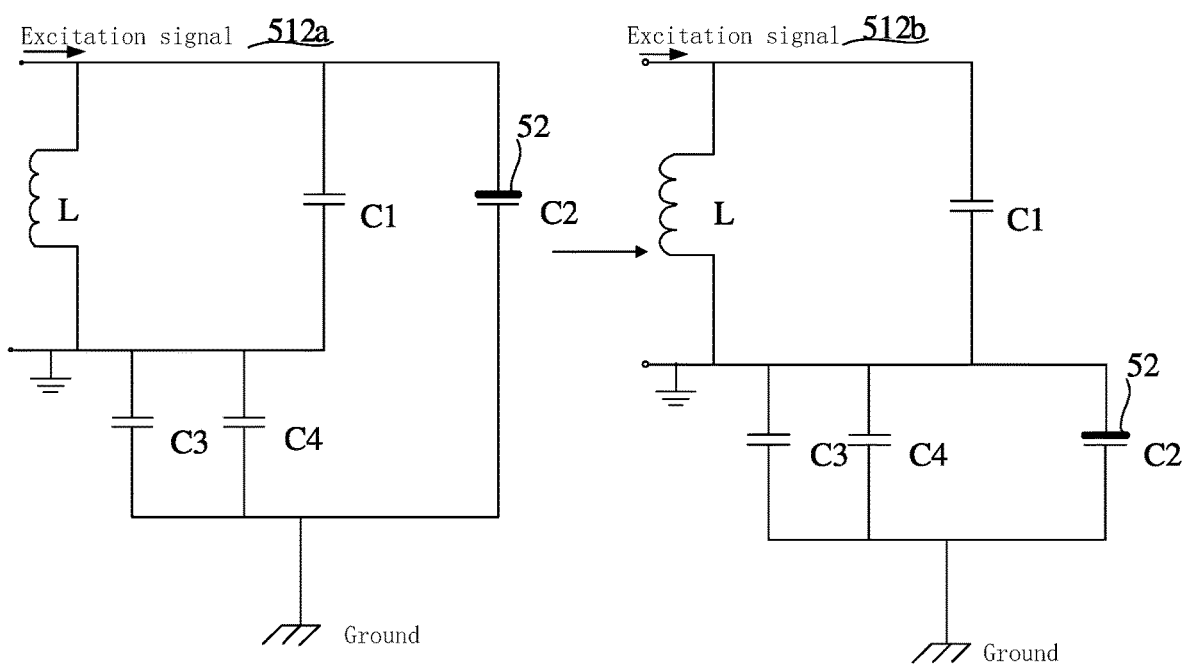
FIG. 16 is a schematic diagram of an equivalent circuit of the first oscillatory circuit and the second oscillatory circuit in a dual oscillation mode provided by an embodiment of the present disclosure.

The oscillatory circuit 512 can include the first oscillatory circuit 512a and the second oscillatory circuit 512b. In some cases, the first oscillatory circuit 512a and the second oscillatory circuit 512b can be regarded as two states of the oscillatory circuit 512. The electrode 52 can belong to one of the first oscillatory circuit 512a or the second oscillatory circuit 512b, and the switching circuit can alternately switch the first oscillatory circuit 512a and the second oscillatory circuit 512b. There are many situations for switching between the first oscillatory circuit 512a and the second oscillatory circuit 512b, as follows:

In the first case, the switching circuit can switch the first oscillatory circuit 512a and the second oscillatory circuit 512b by switching the connection position of the electrode 52 and the oscillatory circuit 512. Please refer to FIG. 16, FIG. 16 is a schematic diagram of an equivalent circuit of the first oscillatory circuit and the second oscillatory circuit in a dual oscillation mode provided by the embodiment of the present disclosure.

The switching circuit couples the electrode 52 to the first end of the first capacitor C1 in the first half of the oscillation period, so that the first capacitor C1 and the second capacitor C2 formed by the electrode 52 and the external conductor are connected in series, the inductor, the first capacitor C1 and the electrode 52 constitutes the first oscillatory circuit 512a. That is, in the first half of the oscillation period, the electrode 52 is coupled to the first end of the first capacitor C1, and the two objects can be specifically coupled through the connecting terminal 514. The inductor, the first capacitor C1 and the electrode 52 constitute the first oscillatory circuit 512a. For example, the detection circuit 513b can output the excitation signal to the first end of the first capacitor C1, so that the capacitance signal generated by the second capacitor C2 formed by the electrode 52 and the external conductor can affect the equivalent capacitance value of the oscillatory circuit 512, so that the inductor L, the first capacitor C1 and the electrode 52 constitute the first oscillatory circuit 512a.

The switching circuit couples the electrode 52 to the second end of the first capacitor C1 in the second half of the oscillation period, so that the oscillatory circuit 512 does not include the second oscillatory circuit 512b formed by the electrode 52, the inductor L and the first capacitor C1. That is, the electrode 52 is coupled to the second end of the first capacitor in the second half of the oscillation period, and the two objects can be specifically coupled through the connection terminal 514. The oscillatory circuit 512 does not include the electrode 52. For example, the detection circuit 513 can output the excitation signal to the first end of the first capacitor C1, and the second end of the first capacitor C1 is grounded, therefore, the electrode 52 is equivalent to the ground and cannot affect the equivalent capacitance of the oscillatory circuit 512, that is, the oscillatory circuit 512 does not include the electrode 52, and the second oscillatory circuit 512 is composed of an inductor and the first capacitor C1.

In this case, the second end of the first capacitor C1 is grounded, and can be coupled to the ground of the sensing circuit 51, or the second terminal of the first capacitor C1 can be used as the ground of the sensing circuit 51.

Figure 17:
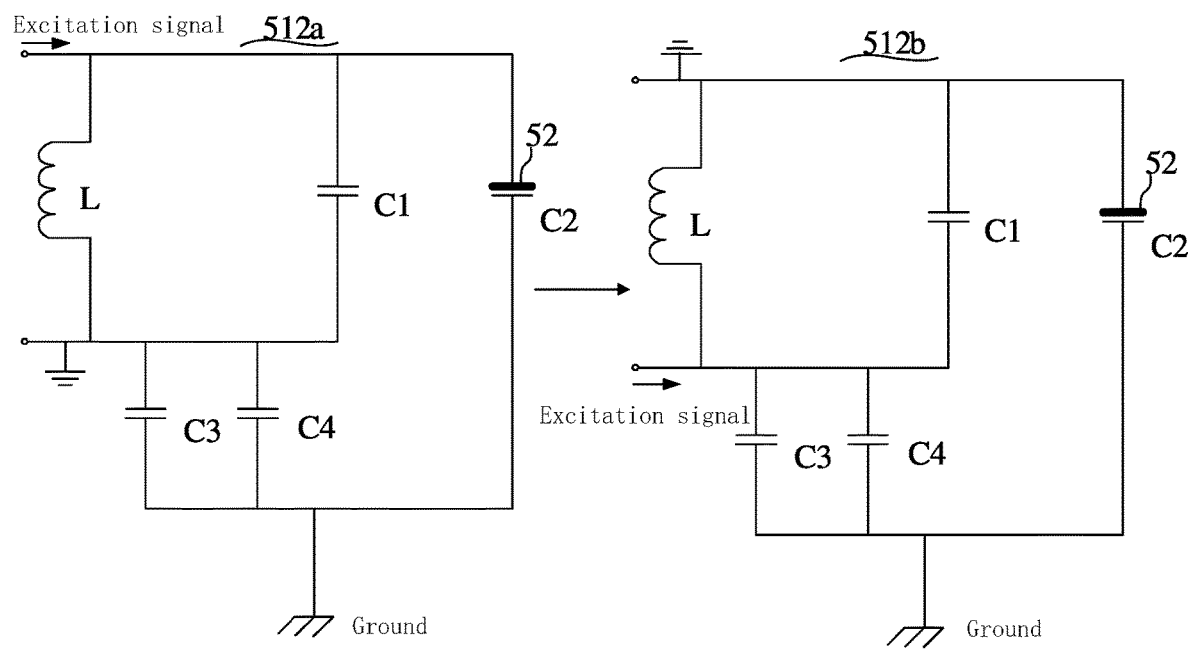
FIG. 17 is a schematic diagram of another equivalent circuit of the first oscillatory circuit and the second oscillatory circuit provided by the embodiment of the present disclosure.

In a second case, the switching circuit realizes switching between the first oscillatory circuit 512a and the second oscillatory circuit 512b by switching the excitation signal output by the detection circuit 513 at the output position of the oscillatory circuit 512. Please refer to FIG. 17, which is another equivalent circuit diagram of the first oscillatory circuit and the second oscillatory circuit provided by the embodiment of the present disclosure.

The electrode 52 is coupled to the first end of the first capacitor C1, and used to form a second capacitor C2 with an external conductor. In this case, the connection relationship between the electrode 52 and the first end of the first capacitor C1 can be stable. The switching circuit outputs the excitation signal output by the detection circuit 513 to the first end of the first capacitor C1 in the first half of the oscillation period, the second end of the first capacitor C1 is grounded, the inductor L, the first capacitor C1 and the electrode 52 constitute the first oscillatory circuit 512a. In this way, the capacitance signal generated by the capacitor formed by the external conductor and the electrode 52 will affect the equivalent capacitance of the oscillatory circuit 512, the inductor L, the first capacitor C1 and the electrode 52 constitute the first oscillatory circuit 512a.

The switching circuit outputs the excitation signal output by the detection circuit 513 to the second end of the first capacitor C1 in the second half of the oscillation period, and the first end of the first capacitor C1 is grounded, so that the oscillatory circuit 512 does not include the electrode 52, the inductor and the first capacitor C1 constitute the second oscillatory circuit 512. In this way, the electrode 52 is grounded through the first end of the first capacitor C1, which cannot affect the equivalent capacitance of the oscillatory circuit 512, so that the oscillatory circuit 512 does not include the electrode 52, the inductor L and the first capacitor C1 constitute the second oscillatory circuit 512b.

In this case, the first terminal of the first capacitor C1 is grounded and, can be coupled to the ground of the sensing circuit 51, or the first terminal of the first capacitor C1 can be used as the ground of the sensing circuit 51.

For the first and second cases described above, the oscillatory circuit 512 includes the third capacitor C3 and the fourth capacitor C4. The capacitance of the ground of the sensing circuit 51 to the ground forms a third capacitance C3. The capacitor coupled to the ground to the mechanical equipment constitutes a fourth capacitor C4. The fourth capacitor C4 is, for example, a capacitor generated by coupling the ground to the main metal conductor of the mechanical equipment (such as a metal bracket, a joint bracket, or other additional metal plates, etc.). The fourth capacitor C4 is much larger than the third capacitor C3.

For example, the calculation process of the oscillation frequency in the above two cases can be as follows:

$$C_{comb} = \frac{(C_3 + C_4) \times C_2}{C_3 + C_4 + C_2} = \beta C_2,$$

$$\beta = \frac{1}{1 + \frac{C_2}{C_3 + C_4}}.$$

Since the ground is connected to the metal frame, it is equivalent to connecting a large capacitor in parallel with the third capacitor C3, that is, the third capacitor C3 and the fourth capacitor C4 are connected in parallel, which actually increases the equivalent capacitance of the third capacitor C3. Therefore the above $\beta \approx 1$.

The first half of the oscillation period is:

$$T_1 = \pi\sqrt{L(C_1 + C_{comb})} = \pi\sqrt{LC_1\left(1 + \frac{\beta C_2}{C_1}\right)}.$$

The second half of the oscillation period is: $T_2 = \pi\sqrt{LC_1}$.

Oscillation frequency $f_s$ detected by detection circuit 513 is:

$$f_s = \frac{1}{T_1 + T_2} = \frac{1}{\pi\sqrt{LC_1}\left(1 + \sqrt{1 + \frac{\beta C_2}{C_1}}\right)}.$$

Since L and C1 are determined, $\beta \approx 1$, and $f_s$ is detected by the detection circuit 513, so $f_s$ is also determined, so C2 can be calculated according to the above formula.

For C2 calculated from the oscillation frequency $f_s$ detected in the single oscillation and double oscillation modes, for example, the distance between the conductor and the electrode 52 is also calculated by the following method:

the distance between the electrode 52 and the external conductor is calculated according to C2:

$$C_2 = \frac{\varepsilon S}{4\pi k d}.$$

wherein, T1 is the first half of the oscillation period, T2 is the second half of the oscillation period, Comb is the equivalent capacitance, β is the capacitance coefficient, ε is the dielectric constant, S is the area between the electrode 52 and the external conductor, and k is the static electricity constant.

The above are only implementations of the present disclosure, and do not limit the scope of the present disclosure. Any equivalent structure or equivalent process transformation made using the content of specification and drawings of this description, or directly or indirectly applied to other related technologies in the same way, all fields are included in the scope of patent protection of the present disclosure.

The invention claimed is:

1. A method of operating a device to avoid a collision with an obstacle, comprising:
   detecting, by an electronic skin of the device, whether an external conductor is approaching the device, wherein the electronic skin comprises a sensing circuit formed on a housing of the device and the sensing circuit is configured to detect whether the external conductor is approaching the device, and wherein the electronic skin comprises a plurality of sensing electrodes formed on the housing, and the plurality of sensing electrodes are respectively connected to the sensing circuit;
   generating at least two electrical signals that represent distances between the external conductor and the plurality of sensing electrodes or changes of the distances between the external conductor and the plurality of sensing electrodes;
   selecting, from each of the at least two electrical signals, an electrical signal that represents a smallest distance among the distances or a largest distance change among the changes of the distances as an electrical signal that represents a distance between the external conductor and the housing of the device or a change of the distance between the external conductor and the housing of the device;
   determining, executed only once, whether the distance between the external conductor and the housing of the device is less than a first threshold value or whether an approaching speed between the external conductor and the housing of the device calculated from the change of the distance between the external conductor and the housing of the device is greater than a second threshold value; and
   controlling the device so as to avoid the collision with the external conductor or to reduce a strength of the collision between the device and the external conductor, when the distance is determined to be less than the first threshold value or the approaching speed between the external conductor and the housing of the device is determined to be greater than the second threshold value,
   wherein the at least two electrical signals correspond to different sensing electrodes respectively, and the different sensing electrodes are located at different positions of the device.

2. The method according to claim 1, wherein the step of controlling the device to avoid the collision with the external conductor comprises:
   controlling a speed of the device to gradually decelerate to zero;
   stopping driving the device in order that the device decelerates to zero when there is no driving force; or
   controlling the device to bypass the external conductor.

3. The method according to claim 2, wherein the step of controlling the device to bypass the external conductor comprises driving the device to bypass the external conductor in a predetermined action.

4. The method according to claim 3, wherein the device is a mechanical-arm type robot and the step of driving the device to bypass the external conductor in the predetermined action comprises:
   driving a mechanical arm of the robot to retract in a position of a current movement of the mechanical arm of the robot;
   determining whether a retraction direction coincides with a direction of the current movement;
   driving the mechanical arm of the robot to retract by a first predetermined distance and then driving the mechanical arm of the robot to move in the direction of the current movement, if the retraction direction of the mechanical arm do not coincide with the direction of the current movement of the mechanical arm; and
   driving the mechanical arm of the robot to move by a second predetermined distance in the direction of the current movement, and then to move outwards the first predetermined distance outwards, and to complete the current movement.

5. The method according to claim 4, wherein before the step of driving the mechanical arm of the robot to retract in the position of the current movement of the mechanical arm of the robot, the method further comprises stopping the current movement of the robot.

6. The method according to claim 3, wherein the device is a mechanical-arm type robot and the step of driving the device to bypass the external conductor in the predetermined action comprises:
   determining a position of the external conductor with respect to a direction of a current movement of a mechanical arm of the robot;
   driving the mechanical arm of the robot to move by a first predetermined distance in a first direction; the first direction is away from the position of the external conductor and is at a first angle to the direction of the current movement; and
   further driving the mechanical arm of the robot to move in the direction of the current movement after driving the mechanical arm of the robot to move by a second predetermined distance in a second direction, wherein the second movement direction is biased toward the direction of the current movement and forms a second angle with the first movement direction.

7. The method according to claim 2, wherein the step of controlling the device to bypass the external conductor comprises:
   controlling the device to bypass the external conductor by at least one of a fuzzy rule method, a genetic algorithm, a neural network, a simulated annealing algorithm, and an ant colony optimization algorithm.

8. The method according to claim 1, wherein the step of controlling the device to reduce the strength of the collision comprises:
   controlling the device to decelerate or make a turn until it is in contact with the external conductor; and
   controlling the device to push the external conductor to continue moving the external conductor at a predetermined speed corresponding to the external conductor 7 after contacting the external conductor.

9. The method according to claim 8, wherein before the step of controlling the device to decelerate or make the turn until it is in contact with the external conductor the method comprises:
   determining whether the device encounters the external conductor after braking the device at a maximum deceleration or turning at a maximum torque in a current movement state; wherein the maximum deceleration and the maximum torque are maximum parameters supported by the device; and
   performing the steps of controlling the device to decelerate or make the turn until it is in contact with the external conductor and controlling the device to push the external conductor to continue moving the external conductor at a predetermined speed corresponding to the external conductor after contacting the external conductor if the device encounters the external conductor, or alternatively ending the steps of controlling the device to decelerate or make the turn until it is in contact with the external conductor and controlling the device to push the external conductor to continue moving at a predetermined speed corresponding to the external conductor after contacting the external conductor if the device does not encounter the external conductor.

10. The method according to claim 9, wherein the step of determining whether the device encounters the external conductor after braking at the maximum deceleration or turning at the maximum torque in the current movement state comprises:
   predicting a movement path and a speed of the external conductor; and
   determining whether the device encounters the external conductor after braking the device at the maximum deceleration or turning at the maximum torque, according to the movement path and the speed of the external conductor in combination with the current movement state of the device.

11. The method according to claim 1, wherein the step of controlling the device to reduce the strength of the collision comprises:
   driving the device to decelerate or make a turn at a maximum deceleration until it is in contact with the external conductor, wherein the maximum deceleration is a maximum parameter supported by the device; and
   driving the device in order that the device pushes the external conductor away with a smaller deceleration after being in contact with the external conductor, and then continuing to move the device.

12. The method according to claim 1, wherein the device is a robot, the robot comprises a first moving component and a second moving component, one end of the first moving component is connected to one end of the second moving component, and the first moving component is driven to move, and drives the second moving component to move, and the second moving component is driven to swing or rotate around the first moving component, and wherein the step of controlling the device to avoid the collision with the external conductor or to reduce the strength of the collision comprises:
   determining which one of the first moving component and the second moving component needs to avoid the collision with the external conductor or to reduce the strength of the collision;
   controlling the first moving component to avoid the collision with the external conductor or reduce the strength of the collision, and simultaneously stopping driving the second moving component or driving the second moving component to gradually decelerate to zero if the first moving component needs to avoid the collision with the external conductor or reduce the strength of the collision; and
   stopping driving the first moving component so that it gradually decelerates to zero or moves away from the external conductor, and simultaneously calculating a movement path of the second moving component that avoids the second moving component from the collision with the external conductor or reduce the strength of the collision based on movement of the first moving component, and controlling the second moving component to move or stop moving according to the movement path, if the second moving component needs to be avoided from the collision with the external conductor or the strength of the collision needs to be reduced.

13. The method according to claim 1, wherein:
   after the step of generating the at least two electrical signals that represent the distances between the external conductor and the plurality of sensing electrodes or the changes of the distances between the external conductor and the plurality of sensing electrodes, the method further comprises:
   calculating coordinates of the external conductor according to each of the at least two electrical signals that represent the distances between the external conductor and the plurality of sensing electrodes or the changes of the distances between the external conductor and the plurality of sensing electrodes, as well as coordinates of the corresponding sensing electrode.

14. A device, comprising:
   a base;
   a moving component connected to the base and capable of swinging, rotating or moving linearly relative to the base;
   a driving component configured to drive or brake the moving component;
   an electronic skin configured to cover at least a part of a surface of the moving component so as to detect whether an external conductor is approaching the device; and
   a control system configured to control the driving component by performing the method according to claim 1.

15. A controller of a device, comprising:
   a circuit board;
   a processor provided on the circuit board;
   a first communication interface configured to be coupled with an electronic skin of the device; and
   a second communication interface configured to be coupled with a drive component of the device;
   wherein, the processor is configured to receive an electrical signal that represents a distance between an external conductor and a housing of the device or a change of the distance between the external conductor and the housing of the device through the first communication interface, and to send an instruction to control the device to avoid a collision with the external conductor or to reduce a strength of the collision through the second communication interface, by performing the method according to claim 1.

* * * * *